(12) United States Patent
Fukuda et al.

(10) Patent No.: US 8,497,191 B2
(45) Date of Patent: Jul. 30, 2013

(54) SELECTIVE EPITAXIAL GROWTH METHOD USING HALOGEN CONTAINING GATE SIDEWALL MASK

(75) Inventors: Masahiro Fukuda, Kawasaki (JP);
Yosuke Shimamune, Kawasaki (JP);
Masaaki Koizuka, Kawasaki (JP);
Katsuaki Ookoshi, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 12/285,723

(22) Filed: Oct. 14, 2008

(65) Prior Publication Data

US 2009/0117715 A1    May 7, 2009

Related U.S. Application Data

(60) Division of application No. 11/717,205, filed on Mar. 13, 2007, now Pat. No. 7,446,394, which is a continuation-in-part of application No. 11/507,524, filed on Aug. 22, 2006, now abandoned.

(30) Foreign Application Priority Data

Feb. 27, 2006  (JP) ................................. 2007-051106
Aug. 25, 2006  (JP) ................................. 2006-229917

(51) Int. Cl.
*H01L 21/20* (2006.01)
*H01L 21/31* (2006.01)
(52) U.S. Cl.
USPC ........... 438/481; 438/779; 438/786; 438/791; 257/632; 257/649
(58) Field of Classification Search
USPC ............ 438/481, 779, 786, 791; 257/E21.04, 257/632, 649, E21.24, E21.192
See application file for complete search history.

(56) References Cited

U.S. PATENT DOCUMENTS

| 5,864,161 A | 1/1999 | Mitani et al. |
| 5,937,300 A | 8/1999 | Sekine et al. |

(Continued)

FOREIGN PATENT DOCUMENTS

| JP | 4-338634 A | 11/1992 |
| JP | 8-153688 A | 6/1996 |

(Continued)

OTHER PUBLICATIONS

T.I. Kamins et al., "Influence of HCl of the chemical vapor deposition and etching of Ge islands on Si(00)"; Applied Physics Letters, vol. 73, No. 13, pp. 1862-1864.

(Continued)

*Primary Examiner* — Walter H Swanson
(74) *Attorney, Agent, or Firm* — Westerman, Hattori, Daniels & Adrian, LLP

(57) ABSTRACT

A semiconductor device in which selectivity in epitaxial growth is improved. There is provided a semiconductor device comprising a gate electrode formed over an Si substrate, which is a semiconductor substrate, with a gate insulating film therebetween and an insulating layer formed over sides of the gate electrode and containing a halogen element. With this semiconductor device, a silicon nitride film which contains the halogen element is formed over the sides of the gate electrode when an SiGe layer is formed over the Si substrate. Therefore, the SiGe layer epitaxial-grows over the Si substrate with high selectivity. As a result, an OFF-state leakage current which flows between, for example, the gate electrode and source/drain regions is suppressed and a manufacturing process suitable for actual mass production is established.

10 Claims, 23 Drawing Sheets

U.S. PATENT DOCUMENTS

| | | | |
|---|---|---|---|
| 6,342,421 B1 | 1/2002 | Mitani et al. | |
| 6,635,938 B1 | 10/2003 | Nakahata et al. | |
| 7,067,434 B2 * | 6/2006 | Colombo et al. | 438/714 |
| 7,105,411 B1 | 9/2006 | Akram et al. | |
| 7,342,290 B2 * | 3/2008 | Burnham et al. | 257/411 |
| 7,547,605 B2 | 6/2009 | Huang | |
| 7,579,248 B2 | 8/2009 | Huang et al. | |
| 2002/0110945 A1 * | 8/2002 | Kuramata et al. | 438/36 |
| 2003/0127695 A1 * | 7/2003 | Ozawa et al. | 257/382 |
| 2005/0014354 A1 * | 1/2005 | Ozawa et al. | 438/595 |
| 2005/0266631 A1 | 12/2005 | Kim et al. | |
| 2005/0280098 A1 | 12/2005 | Shin et al. | |
| 2006/0022228 A1 | 2/2006 | Hoshi et al. | |
| 2006/0088968 A1 * | 4/2006 | Shin et al. | 438/299 |
| 2006/0187618 A1 * | 8/2006 | Ilda et al. | 361/524 |
| 2007/0148919 A1 | 6/2007 | Lin et al. | |
| 2008/0268598 A1 * | 10/2008 | Choi et al. | 438/294 |

FOREIGN PATENT DOCUMENTS

| | | |
|---|---|---|
| JP | 8-167717 A | 6/1996 |
| JP | 2000-164857 A | 6/2000 |
| JP | 2001-250944 A | 9/2001 |
| JP | 2003-204063 A | 7/2003 |
| JP | 2004-363199 A | 12/2004 |
| JP | 2006-13428 A | 1/2006 |

OTHER PUBLICATIONS

Japanese Office Action dated May 8, 2012, issued in corresponding Japanese Patent Application 2006-229917, 4 pages with English Translation (5 pages).

Japanese Office Action dated Aug. 21, 2012, issued in corresponding Japanese Patent Application No. 2006-229917, w/ English Translation.

* cited by examiner

SAMPLE H

SELECTIVE EPITAXIAL GROWTH METHOD USING HALOGEN CONTAINING GATE SIDEWALL MASK

CROSS-REFERENCE TO RELATED APPLICATIONS

This application is a division of U.S. application Ser. No. 11/717,205, filed on Mar. 13, 2007, which is a continuation-in-part of Ser. No. 11/507,524 filed on Aug. 22, 2006, and which is based upon and claims the benefits of priority from the prior Japanese Patent Application Nos. 2006-051106 and 2006-229917, the entire contents of which are incorporated herein by reference.

BACKGROUND OF THE INVENTION (1) Field of the Invention

This invention relates to a semiconductor device and a method for fabricating a semiconductor device and, more particularly, to a semiconductor device in which a semiconductor can be made to epitaxial-grow with high selectivity and a semiconductor device fabrication method by which a semiconductor is made to epitaxial-grow with high selectivity.

(2) Description of the Related Art

Attention has recently been riveted on an elevated or recessed source/drain MOSFET in which a silicon (Si) film or a silicon germanium (SiGe) film is formed in source/drain regions of a MOSFET. It is expected that these MOSFETs will be utilized as techniques for improving the performance of transistors beyond the 90 nm node.

A structure in which an SiGe layer, for example, is made to epitaxial-grow on an Si substrate is adopted in source/drain regions especially in a recessed source/drain MOSFET. If the SiGe layer is made to epitaxial-grow in the source/drain regions, a channel region is compressed from the direction of a source/drain because the lattice constant of SiGe is greater than the lattice constant of Si. This improves hole mobility in the channel region. Therefore, with this type of MOSFET, current driving capability can be enhanced significantly.

The method of making the SiGe layer selectively epitaxial-grow only on the Si substrate is adopted to make the SiGe layer epitaxial-grow in the source/drain regions of the recessed source/drain MOSFET. By making the SiGe layer selectively epitaxial-grow only in the recessed source/drain region, source/drain electrodes are electrically separated from a gate electrode by an insulating layer which is a side wall. With such an element, it is important to suppress an OFF-state leakage current which flows between a source/drain electrode and a gate electrode.

In actual selective epitaxial growth, however, there are cases where an SiGe layer also grows on a side wall because of low selectivity between an Si substrate and an insulating layer (deterioration in selectivity).

FIG. 21 is a sectional view showing an important part of a recessed source/drain MOSFET in which a deterioration in selectivity has occurred.

As can be seen from FIG. 21, an SiGe layer 330 is formed not only on source/drain electrodes 310 on a substrate 300 but also on side walls 320 which are insulating layers. In this case, the source/drain electrodes 310 are electrically connected to a gate electrode 340 and an excessive OFF-state leakage current flows between the source/drain electrodes 310 and the gate electrode 340. As a result, a function as a MOSFET is lost. Factors in a deterioration in selectivity have not fully been clarified because it is caused by a complicated surface reaction. However, the following, for example, may be a factor in a deterioration in selectivity.

Insulating layers formed in an LSI manufacturing process are mainly an Si oxide film and an Si nitride film. These films are formed by various methods such as thermal chemical vapor deposition (CVD) and plasma CVD. The state of the surface of an insulating layer formed depends on a growth method. All the surface of an insulating layer is not in a state of saturated bonding. For example, dangling bonds or the like are exposed in some portions of the surface of an insulating layer. If semiconductor material gas adsorbs to a dangling bond or the like, a semiconductor nucleus begins to grow on the insulating layer after the elapse of a certain period of time (latent period). This nucleus grows to a film. As a result, a semiconductor film is formed on the insulating layer.

To establish a selective growth process, it is preferable that the latent period on the insulating layer should be lengthened substantially. However, the latent period depends on the state of the surface of the insulating layer, a growth condition, or the like. Accordingly, really an ample latent period is not secured, depending on the state of the surface of the insulating layer, a growth condition, or the like.

As stated above, in an actual selective epitaxial growth process it is difficult to make a semiconductor film epitaxial-grow only on the surface of a specific semiconductor.

To solve this problem, an attempt to utilize an etching technique is made. This method comprises the steps of adding hydrogen chloride (HCl) gas for etching to semiconductor material gas and making SiGe selectively epitaxial-grow only on the surface of a semiconductor substrate while etching SiGe which grows on an insulating layer (see, for example, Japanese Patent Laid-Open Publication No. 2004-363199 and T. I. Kamins, G. A. D. Briggs, and R. Stanley Williams, "Influence of HCl on the chemical vapor deposition and etching of Ge islands on Si(001)" APPLIED PHYSICS LETTERS, Vol. 73, No. 13, pp. 1862-1864 (1998)).

With the above method using an etching technique, however, the temperature of the substrate must be higher than or equal to 600° C. to increase the rate at which SiGe that grows on the insulating layer is etched by, for example, HCl. If the temperature of the substrate is higher than or equal to 600° C., the influence of the thermal diffusion of impurities contained in the element in extremely small quantities becomes powerful. In addition, the SiGe layer and the insulating layer are, for example, eroded by HCl.

On the other hand, if the temperature of the substrate is lower than or equal to 600° C., the rate at which SiGe is etched by HCl is slow. Accordingly, even if semiconductor material gas is mixed with HCl gas as additive gas at the time of the selective epitaxial growth of SiGe, the rate at which SiGe is etched is slower than the rate at which SiGe grows. As a result, SiGe also grows on the insulating layer. This means that a manufacturing process condition suitable for actual mass production cannot be obtained.

SUMMARY OF THE INVENTION

The present invention was made under the background circumstances described. To suppress an OFF-state leakage current and establish a manufacturing process suitable for actual mass production, the present invention aims to provide a semiconductor device in which a semiconductor can be made to epitaxial-grow with high selectivity and a semiconductor device fabrication method by which a semiconductor is made to epitaxial-grow with high selectivity.

In order to achieve the above object, there is provided a semiconductor device comprising a gate electrode formed over a semiconductor substrate with a gate insulating film therebetween, an insulating film formed over side wall portions of the gate electrode and having a laminated structure, and a semiconductor epitaxial growth layer formed on the semiconductor substrate, halogen element content of a top layer of the insulating film having the laminated structure being higher than halogen element contents of other layers of the laminated structure.

Furthermore, in order to achieve the above object, there is provided a semiconductor device comprising a gate electrode formed over a semiconductor substrate with a gate insulating film therebetween, an insulating film formed over side wall portions of the gate electrode and containing a halogen element, and a semiconductor epitaxial growth layer formed on the semiconductor substrate, a content of the halogen element in the insulating film having a slope.

In addition, in order to achieve the above object, there is provided a semiconductor device fabrication method comprising the steps of forming a first insulating film over a first semiconductor layer, forming a second insulating film in which a content of a halogen element is higher than a content of the halogen element in the first insulating film over the first insulating film, exposing a surface of the first semiconductor layer by removing part of the first insulating film and part of the second insulating film, and making a second semiconductor layer selectively epitaxial-grow on the exposed surface of the first semiconductor layer by supplying a material for forming the second semiconductor layer onto the surface of the first semiconductor layer and a surface of the second insulating film.

Moreover, in order to achieve the above object, there is provided a semiconductor device fabrication method comprising the steps of forming an insulating film which contains a halogen element over a first semiconductor layer, exposing a surface of the first semiconductor layer by removing part of the insulating film, and making a second semiconductor layer selectively epitaxial-grow on an exposed surface of the first semiconductor layer by supplying a material for forming the second semiconductor layer onto the exposed surface of the first semiconductor layer and a surface of the insulating film, a content of the halogen element in a surface portion of the insulating film being made higher than a content of the halogen element in an inside of the insulating film in the step of forming the insulating film which contains the halogen element over the first semiconductor layer.

Furthermore, in order to achieve the above object, there is provided a semiconductor device fabrication method comprising the steps of supplying a material for suppressing growth of a second semiconductor layer over an insulating film onto a surface of a first semiconductor layer and a surface of the insulating film, and making the second semiconductor layer selectively epitaxial-grow over the first semiconductor layer by supplying a material for forming the second semiconductor layer onto the surface of the first semiconductor layer and the surface of the insulating film.

In addition, in order to achieve the above object, there is provided a semiconductor device fabrication method comprising the steps of forming a gate electrode over a first semiconductor layer with a gate insulating film therebetween, forming an insulating film over side wall portions of the gate electrode, supplying a material for suppressing growth of a second semiconductor layer over the insulating film onto a surface of the first semiconductor layer and a surface of the insulating film, and making the second semiconductor layer selectively epitaxial-grow over the first semiconductor layer by supplying a material for forming the second semiconductor layer onto the surface of the first semiconductor layer and the surface of the insulating film.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described in detail with reference to the drawings.

A semiconductor device fabricated by using a selective epitaxial growth method will be described first. A recessed source/drain MOSFET will be taken as an example and its structure will be described.

A semiconductor device according to a first embodiment of the present invention will be described first.

Figure 1:
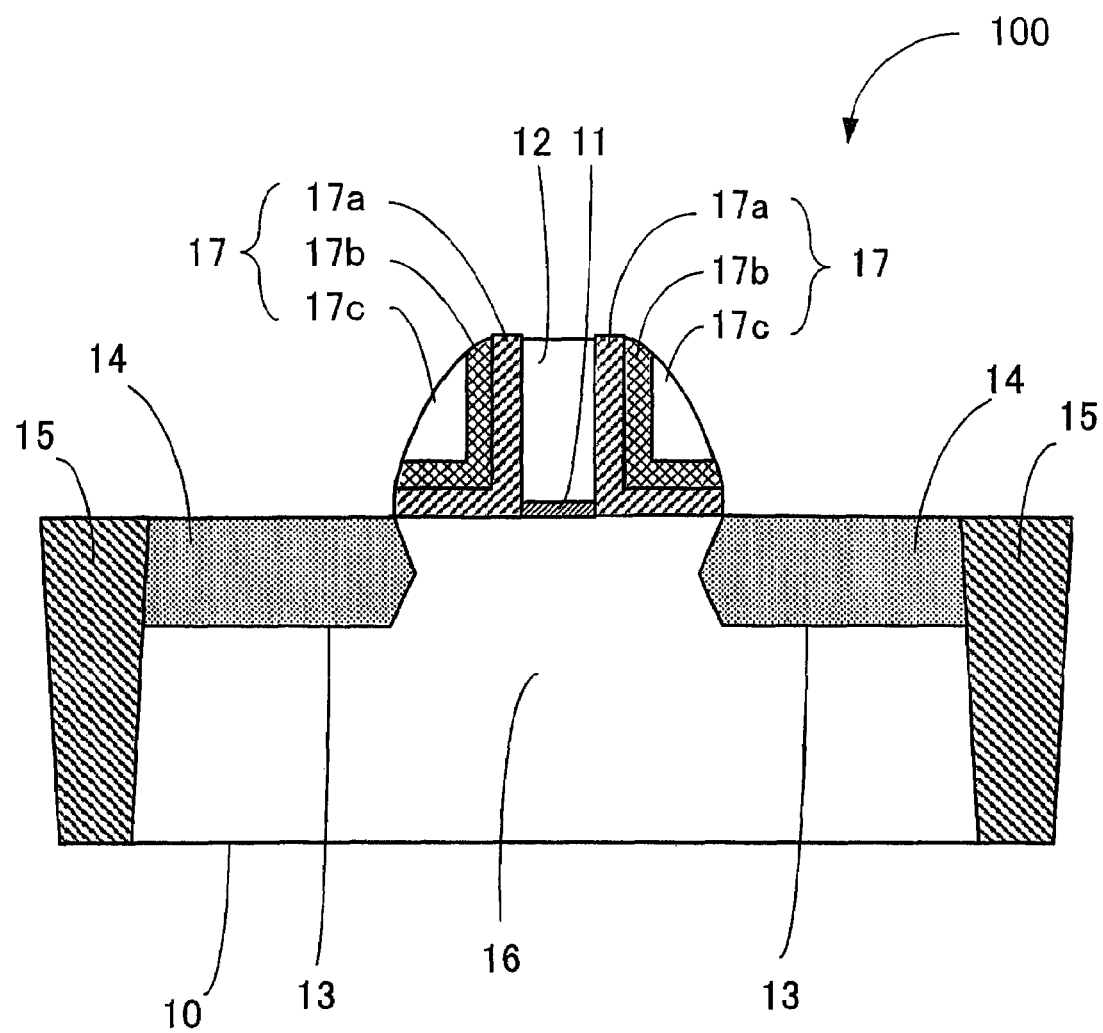
FIG. 1 is a sectional view showing an important part of a semiconductor device for which selective epitaxial growth is used (part 1).

FIG. 1 is a sectional view showing an important part of a semiconductor device for which selective epitaxial growth is used.

In FIG. 1, the structure of an important part of a p-type MOS transistor is shown as an example of a semiconductor device 100.

To be concrete, a gate insulating film 11 with a thickness of 1 to 2 nm is formed over an Si substrate 10. A gate electrode 12 is formed over the gate insulating film 11. The gate insulating film 11 is a silicon oxide film, a silicon nitride film, a silicon oxide nitride film, or the like. The gate electrode 12 is formed by using polycrystalline silicon which contains p-type impurity elements such as boron (B) elements.

The Si substrate 10 is then recessed to form source/drain regions 13. An SiGe layer 14 which serves as source/drain electrodes is formed in the source/drain regions 13. The SiGe layer 14 is formed by performing selective epitaxial growth in the source/drain regions 13. A region defined with isolation regions 15 formed in the Si substrate 10 is an n-type well region 16.

An insulating layer 17 which serves as side walls is formed on sides of the gate electrode 12.

To form the insulating layer 17, a silicon oxide film 17a is formed on the sides of the gate electrode 12. A silicon nitride film 17b is formed over the silicon oxide film 17a.

The silicon nitride film 17b is an insulating film which contains Si and nitrogen (N). By forming the silicon oxide film 17a and the silicon nitride film 17b on the sides of the gate electrode 12, insulation is secured between the gate electrode 12 and the SiGe layer 14 formed in the source/drain regions 13. In addition, insulation is secured between via contacts (not shown) formed in the SiGe layer 14 and the gate electrode 12.

A silicon nitride film 17c which contains a halogen element is formed over the silicon nitride film 17b. In this case, the halogen element is, for example, chlorine (Cl). The chlorine content of the silicon nitride film 17c is, for example, $5 \times 10^{19}$ to $5 \times 10^{21}$ atoms/cm$^3$.

The semiconductor device fabricated by using selective epitaxial growth has been described with a recessed source/drain MOSFET as an example. However, the semiconductor device 100 fabricated by using the selective epitaxial growth method may be an elevated source/drain MOSFET in which an Si substrate 10 is not recessed for forming an SiGe layer 14.

Furthermore, the insulating layer 17 has a three-layer structure including the silicon oxide film 17a, the silicon nitride film 17b, and the silicon nitride film 17c. However, the number of layers is not limited to three. Only the condition that the top layer is, for example, a silicon nitride film which contains chlorine and that the chlorine content of the top layer is higher than the chlorine contents of other layers must be met.

As stated above, the semiconductor device 100 includes the gate electrode 12 formed over the Si substrate 10, which is a semiconductor substrate, with the gate insulating film 11 therebetween and the insulating layer 17 which is formed on the sides of the gate electrode 12 and which contains a halogen element.

With the above semiconductor device 100, the silicon nitride film 17c which contains a halogen element has been formed as the side walls when the SiGe layer 14 is formed over the Si substrate 10. Accordingly, the SiGe layer 14 is not formed over the silicon nitride film 17c. That is to say, the silicon nitride film 17c functions as a mask and the SiGe layer 14 epitaxial-grows over the Si substrate 10 with high selectivity.

As a result, an OFF-state leakage current which flows between, for example, the gate electrode 12 and the source/drain regions 13 is suppressed and a manufacturing process suitable for actual mass production is established.

A semiconductor device according to a second embodiment of the present invention will be described next.

Figure 2:
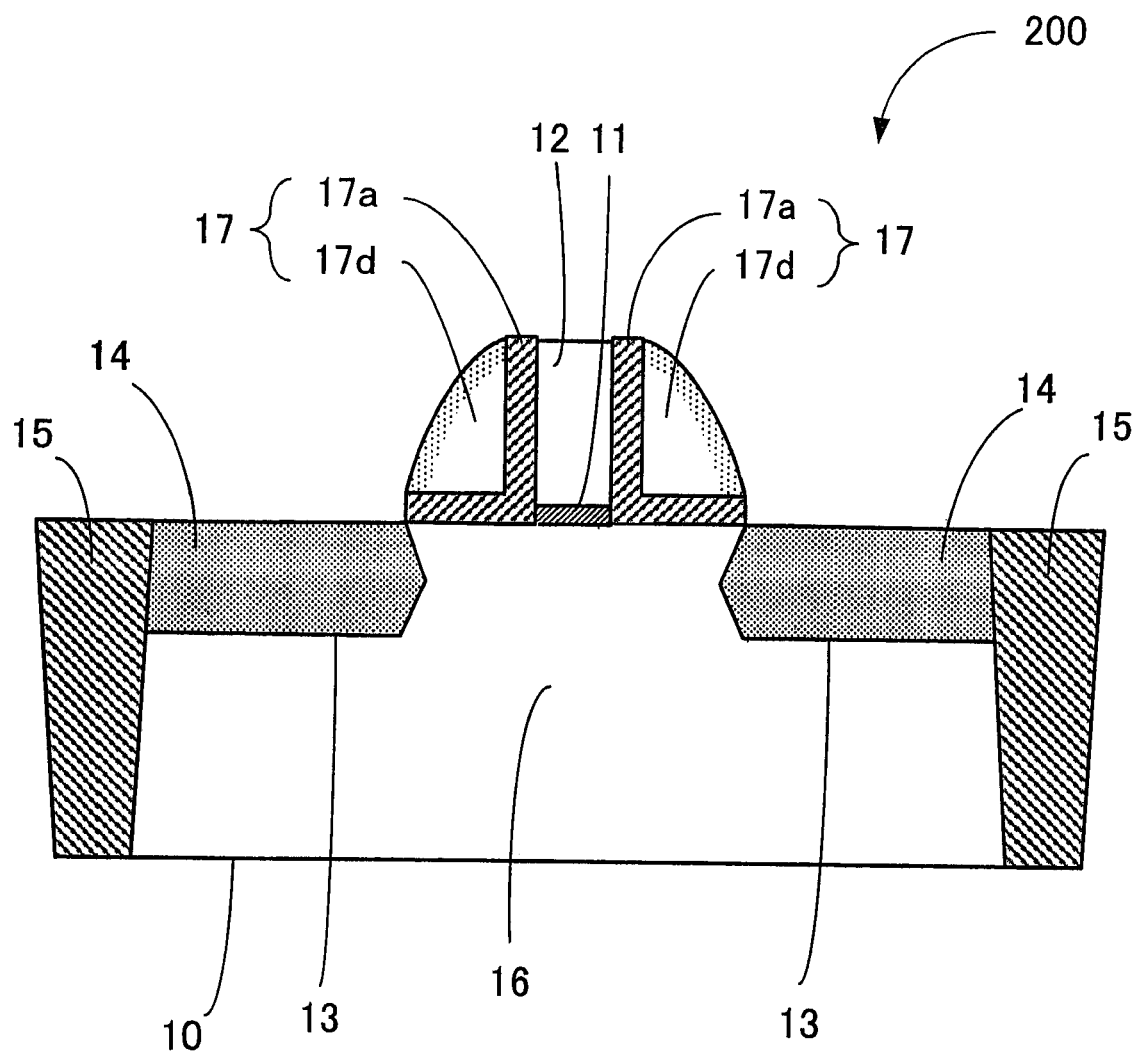
FIG. 2 is a sectional view showing an important part of a semiconductor device for which the selective epitaxial growth is used (part 2).

FIG. 2 is a sectional view showing an important part of a semiconductor device for which the selective epitaxial growth is used.

Components in FIG. 2 that are the same as those shown in FIG. 1 are marked with the same symbols and detailed descriptions of them will be omitted.

With a semiconductor device 200, an insulating layer 17 which serves as side walls is formed on sides of a gate electrode 12.

To form the insulating layer 17, a silicon oxide film 17a is formed on the sides of the gate electrode 12. A silicon nitride film 17d is formed over the silicon oxide film 17a.

The silicon nitride film 17d contains a halogen element. In this case, the halogen element is, for example, chlorine (Cl). The chlorine content of the silicon nitride film 17d has a slope from an interface between the silicon oxide film 17a and the silicon nitride film 17d to the surface of the silicon nitride film 17d.

The degree of the slope is as follows. An insulating layer which contains Si and N is formed near the interface between the silicon oxide film 17a and the silicon nitride film 17d and the chlorine content of the silicon nitride film 17d gradually increases from near the interface to the surface of the silicon nitride film 17d.

That is to say, the insulating film which contains Si and N is formed right over the silicon oxide film 17a. Therefore, insulation is secured between the gate electrode 12 and an SiGe layer 14. In addition, insulation is secured between via contacts (not shown) formed in the SiGe layer 14 and the gate electrode 12.

The chlorine content near the surface of the silicon nitride film 17d is $5 \times 10^{19}$ to $5 \times 10^{21}$ atoms/cm$^3$.

If insulation can fully be secured by a silicon nitride film which contains Cl, side walls made up of the silicon nitride film and the silicon oxide film 17a may be formed by forming the silicon nitride film on the silicon oxide film 17a instead of forming the insulating layer which contains Si and N near the interface between the silicon oxide film 17a and the silicon nitride film 17d. Instead of forming the silicon oxide film 17a, a silicon nitride film which contains a halogen element may be formed so as to directly cover the gate electrode 12 and extension regions.

If insulation can fully be secured by a silicon nitride film which contains Cl, the chlorine content of the silicon nitride film formed over the silicon oxide film 17a need not have a slope. That is to say, the silicon nitride film the chlorine content of which is uniform may be formed over the silicon oxide film 17a.

The semiconductor device fabricated by using selective epitaxial growth has been described with a recessed source/drain MOSFET as an example. However, the semiconductor device 200 fabricated by using the selective epitaxial growth method may be an elevated source/drain MOSFET in which an Si substrate 10 is not recessed for forming an SiGe layer 14.

As stated above, the semiconductor device 200 includes the gate electrode 12 formed over the Si substrate 10, which is a semiconductor substrate, with the gate insulating film 11 therebetween and the insulating layer 17 which is formed on the sides of the gate electrode 12 and which contains a halogen element.

With the above semiconductor device 200, the silicon nitride film 17d which contains a halogen element has been formed as the side walls when the SiGe layer 14 is formed over the Si substrate 10. Accordingly, the SiGe layer 14 is not formed over the silicon nitride film 17d. That is to say, the silicon nitride film 17d functions as a mask and the SiGe layer 14 epitaxial-grows over the Si substrate 10 with high selectivity.

As a result, an OFF-state leakage current which flows between, for example, the gate electrode 12 and the source/drain regions 13 is suppressed and a manufacturing process suitable for actual mass production is established.

The selective epitaxial growth method will now be described.

The basic principles of the selective epitaxial growth method will be described first.

Figure 3:
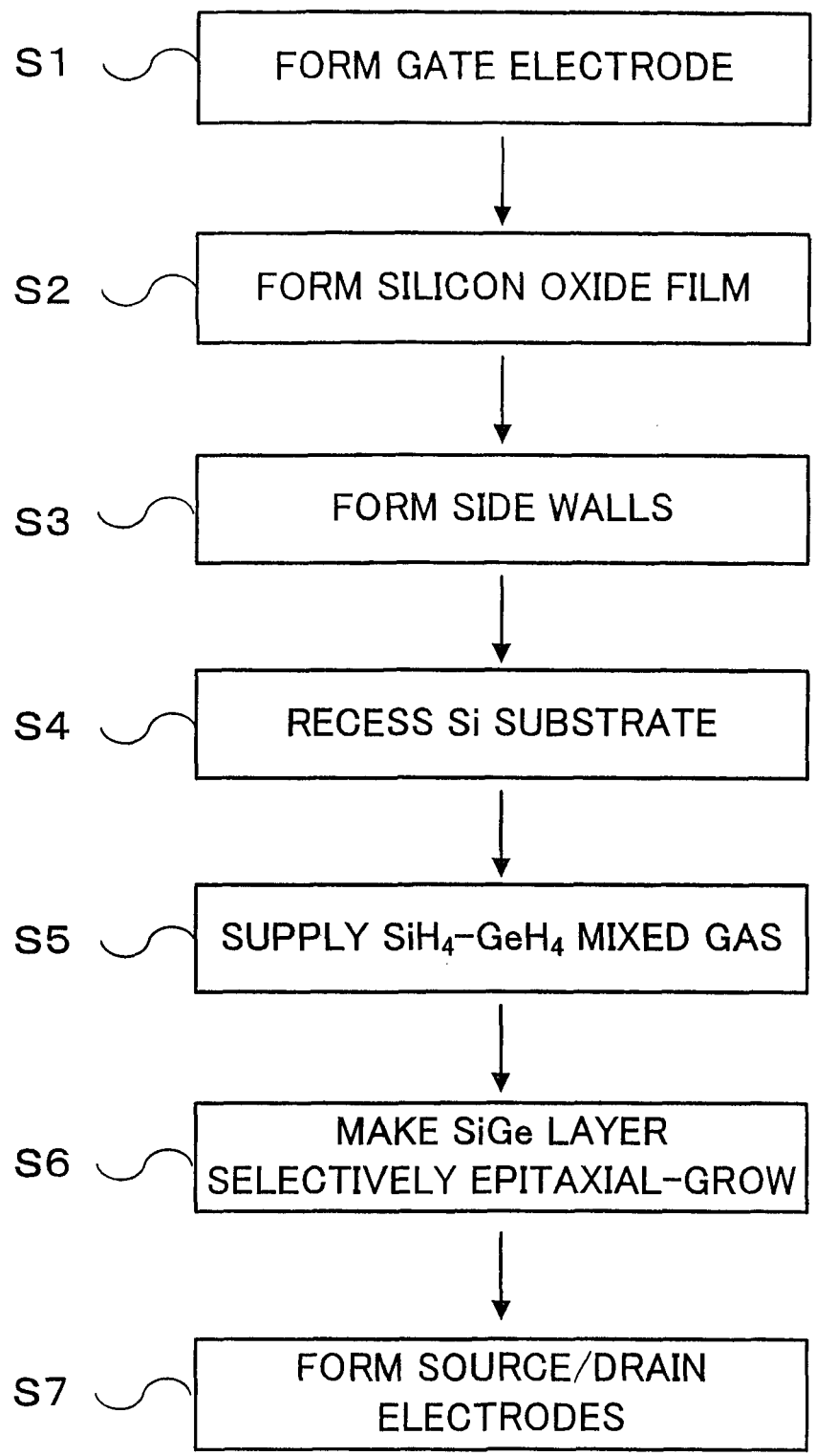
FIG. 3 is an example of a flow chart of fabricating a semiconductor device by using the selective epitaxial growth.

FIG. 3 is an example of a flow chart of fabricating a semiconductor device by using selective epitaxial growth.

First, an Si substrate is used as a first semiconductor layer and a gate electrode is formed over the Si substrate (step S1). Next, a silicon oxide film is formed over a top of the gate electrode, sides of the gate electrode, and the Si substrate (step S2). An insulating film which contains a halogen element is then formed over the silicon oxide film.

In this case, the insulating film which contains a halogen element is a laminated insulating film of insulating films which contain different components, or an insulating film the halogen content of which has a slope.

A laminated insulating film of insulating films which contain different components is formed in, for example, the following way. A silicon nitride film (first insulating film) which does not contain Cl or which contains a very small amount of Cl is formed over a silicon oxide film. A silicon nitride film (second insulating film) the chlorine content of which is higher than the chlorine content of the first insulating film is then formed.

An insulating film the halogen content of which has a slope is formed in, for example, the following way. A silicon nitride film which contains Cl is formed over a silicon oxide film. The chlorine content of the silicon nitride film is gradually increased from an interface between the silicon oxide film and the silicon nitride film to the surface of the silicon nitride film.

The above silicon oxide film and insulating film which contains a halogen element are then etched to form side walls on the sides of the gate electrode (step S3). After that, portions of the Si substrate where source/drain electrodes are to be formed are etched to form recess regions (step S4). Gas, such as monosilane ($SiH_4$)-monogermane ($GeH_4$)—HCl-hydrogen ($H_2$) mixed gas, used as a material for forming a second semiconductor layer is then supplied (step S5). By doing so, an SiGe layer, which is the second semiconductor layer, is made to selectively epitaxial-grow in the recess regions (step S6), and the source/drain electrodes of the SiGe layer with predetermined thickness are formed (step S7).

To fabricate an elevated source/drain MOSFET, the above step S4 is omitted. That is to say, after step S3 is performed, step S5 is performed. By doing so, an SiGe layer is made to selectively epitaxial-grow over an Si substrate.

As stated above, with the selective epitaxial growth method by which a semiconductor is made to selectively epitaxial-grow, a material for forming the second semiconductor layer is supplied onto an exposed surface of the first semiconductor layer and an exposed surface of the insulating film which contains a halogen element.

As a result, an OFF-state leakage current which flows between, for example, a gate electrode 12 and source/drain regions 13 is suppressed and a manufacturing process suitable for actual mass production is established.

Processes for fabricating a semiconductor device by using the selective epitaxial growth method will now be described concretely.

Each of FIGS. 4 through 10 is a sectional view showing an important part of the process for making an SiGe layer selectively epitaxial-grow in recess regions of a semiconductor substrate with a recessed source/drain MOSFET as an example.

A process for fabricating a semiconductor device by using the selective epitaxial growth method, according to a first embodiment of the present invention will be described first. The semiconductor device shown in FIG. 1 is fabricated by this process.

Figure 4:
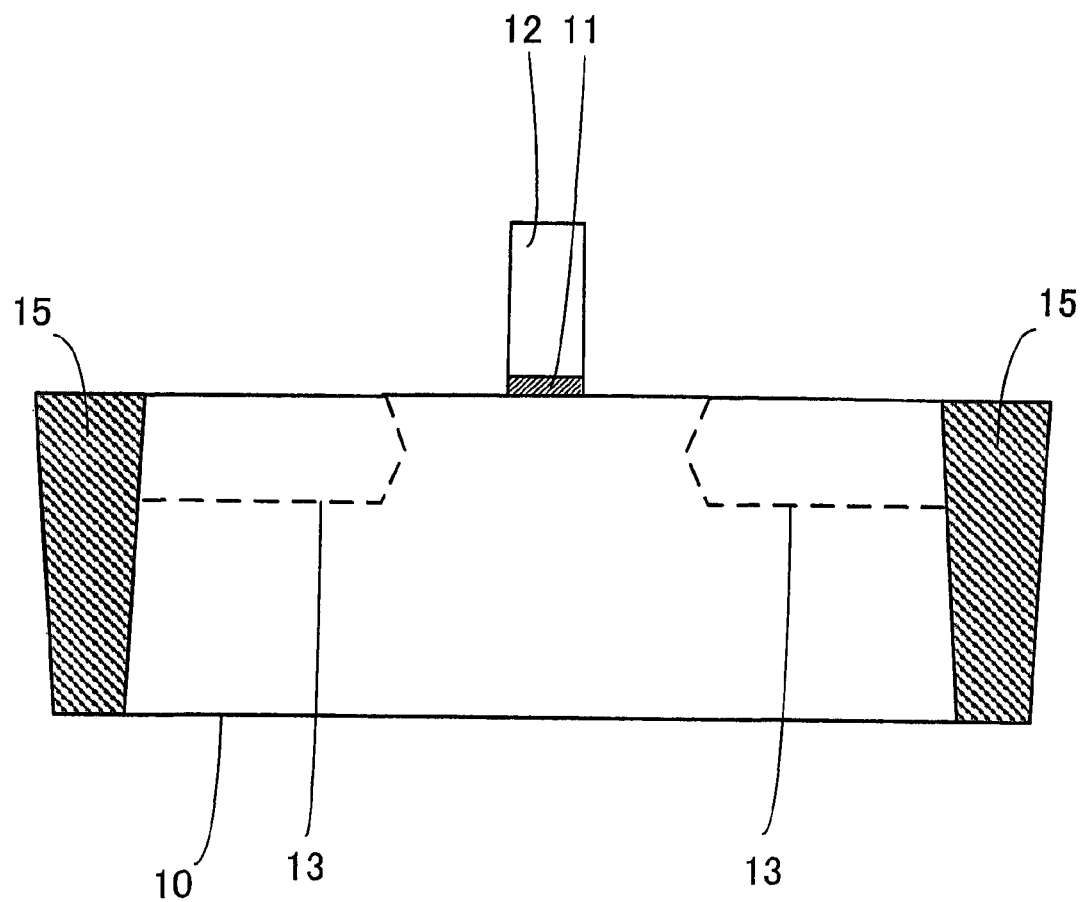
FIG. 4 is a sectional view showing an important part of the step of forming the gate electrode.

FIG. 4 is a sectional view showing an important part of the step of forming the gate electrode.

The Si substrate 10 is used first as a semiconductor substrate which is the first semiconductor layer. After the isolation regions 15 are formed, the gate electrode 12 is formed over the Si substrate 10 with the gate insulating film 11 therebetween by a well-known method. In FIG. 4, regions indicated by dashed lines are the source/drain regions 13 to be formed later.

Figure 5:
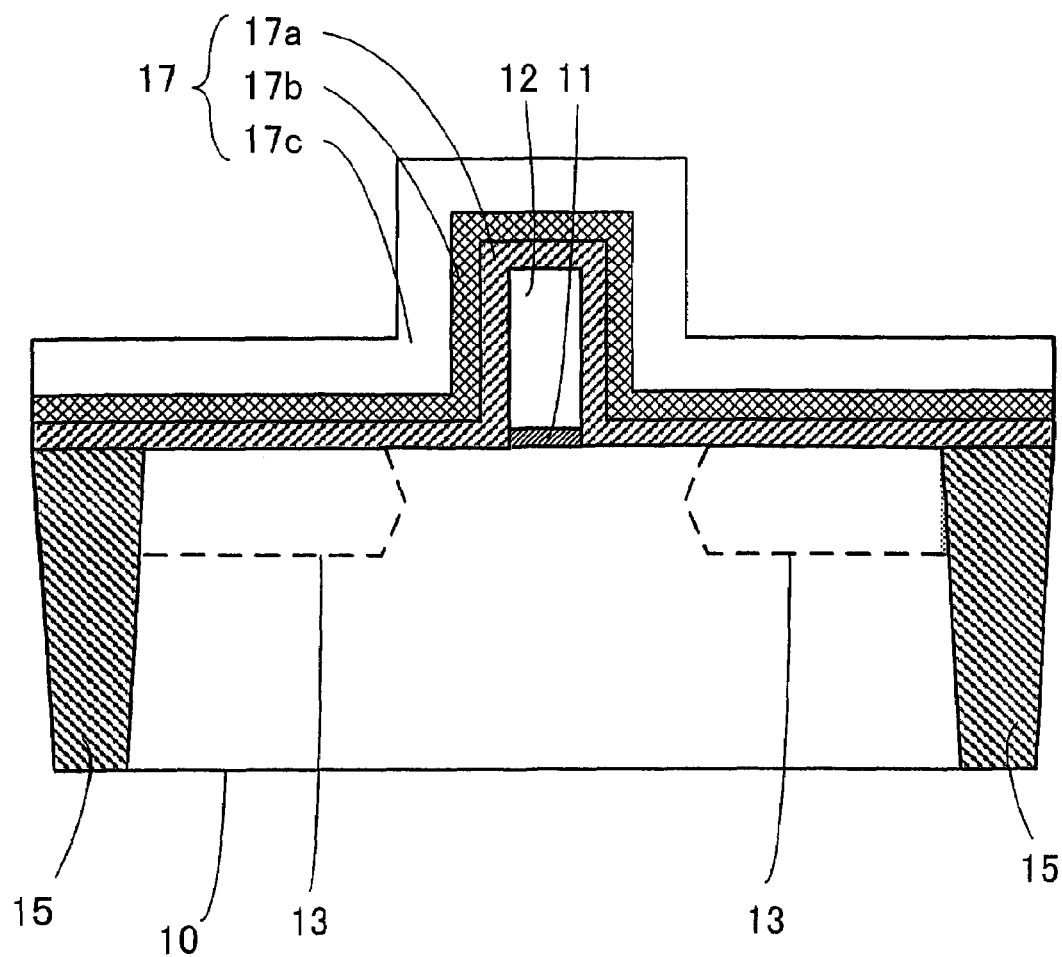
FIG. 5 is a sectional view showing an important part of the step of forming the insulating layer (part 1).

FIG. 5 is a sectional view showing an important part of the step of forming the insulating layer.

The silicon oxide film 17a with a thickness of 1 to 10 nm is formed over the Si substrate 10 and the gate electrode 12 by a CVD method.

The silicon nitride film 17b which is the first insulating film is then formed over the silicon oxide film 17a by the CVD method. Gas, such as disilane ($Si_2H_6$)-ammonia ($NH_3$) mixed gas or dichlorosilane ($SiH_2Cl_2$)—$NH_3$ mixed gas, is used as a material for forming the silicon nitride film 17b.

Gas obtained by mixing chlorosilane-based gas, such as $SiH_4$, monochlorosilane ($SiH_3Cl$), trichlorosilane ($SiHCl_3$), or tetrachlorosilane ($SiCl_4$), with hydrazine ($N_2H_4$) or the like may be used as a material for forming the silicon nitride film 17b.

The silicon nitride film 17c which is the second insulating film and the chlorine content of which is higher than the chlorine content of the silicon nitride film 17b is then formed over the silicon nitride film 17b by the CVD method. $SiH_2Cl_2$—$NH_3$ mixed gas is used as a material for forming the silicon nitride film 17c. Gas obtained by mixing $SiH_3Cl$, $SiHCl_3$, $SiCl_4$ or the like with $N_2H_4$ may be used as a material for forming the silicon nitride film 17c.

To form the silicon nitride film 17c the chlorine content of which is higher than the chlorine content of the silicon nitride film 17b, the ratio of, for example, an $SiH_2Cl_2$ flow rate to an $NH_3$ flow rate is set to a great value compared with the case where the silicon nitride film 17b is formed. Alternatively, the temperature of the Si substrate 10 at the time of supplying $SiH_2Cl_2$—$NH_3$ mixed gas is lowered compared with the case where the silicon nitride film 17b is formed.

As a result, the silicon nitride film 17c the chlorine content of which is higher than the chlorine content of the silicon nitride film 17b can be formed. The chlorine content of the silicon nitride film 17c formed is $5 \times 10^{19}$ to $5 \times 10^{21}$ atoms/$cm^3$.

When the above $SiH_2Cl_2$—$NH_3$ mixed gas is supplied to form the silicon nitride films 17b and 17c, the ratio of an SiH$_2$Cl$_2$ flow rate to an NH$_3$ flow rate is higher than or equal to 0.05 and lower than or equal to 10. While the silicon nitride films 17b and 17c are formed, pressure is lower than or equal to 5.7 Pa. When SiH$_2$Cl$_2$—NH$_3$ mixed gas is supplied, the temperature of the Si substrate 10 is between 550 and to 850° C. The thickness of the silicon nitride films 17b and 17c formed is 1 to 30 nm.

Figure 6:
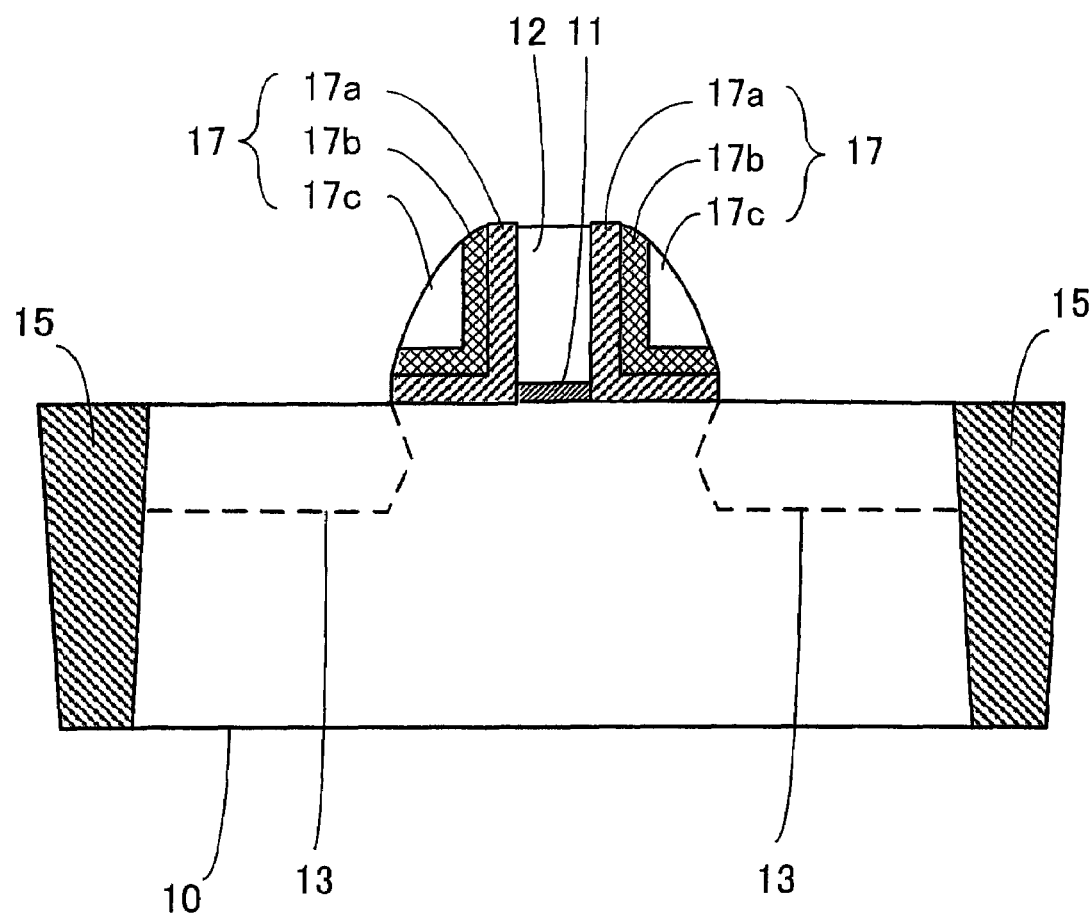
FIG. 6 is a sectional view showing an important part of the step of forming the side walls (part 1).

FIG. 6 is a sectional view showing an important part of the step of forming the side walls.

The silicon oxide film 17a and the silicon nitride films 17b and 17c formed in the preceding step are etched so that the silicon oxide film 17a and the silicon nitride films 17b and 17c will become the side walls of the gate electrode 12.

As a result, the insulating layer 17 made up of the silicon oxide film 17a and the silicon nitride films 17b and 17c is formed on the sides of the gate electrode 12 as the side walls.

The surface in the source/drain regions 13 of the Si substrate 10 completely gets exposed as a result of the above etching.

Figure 7:
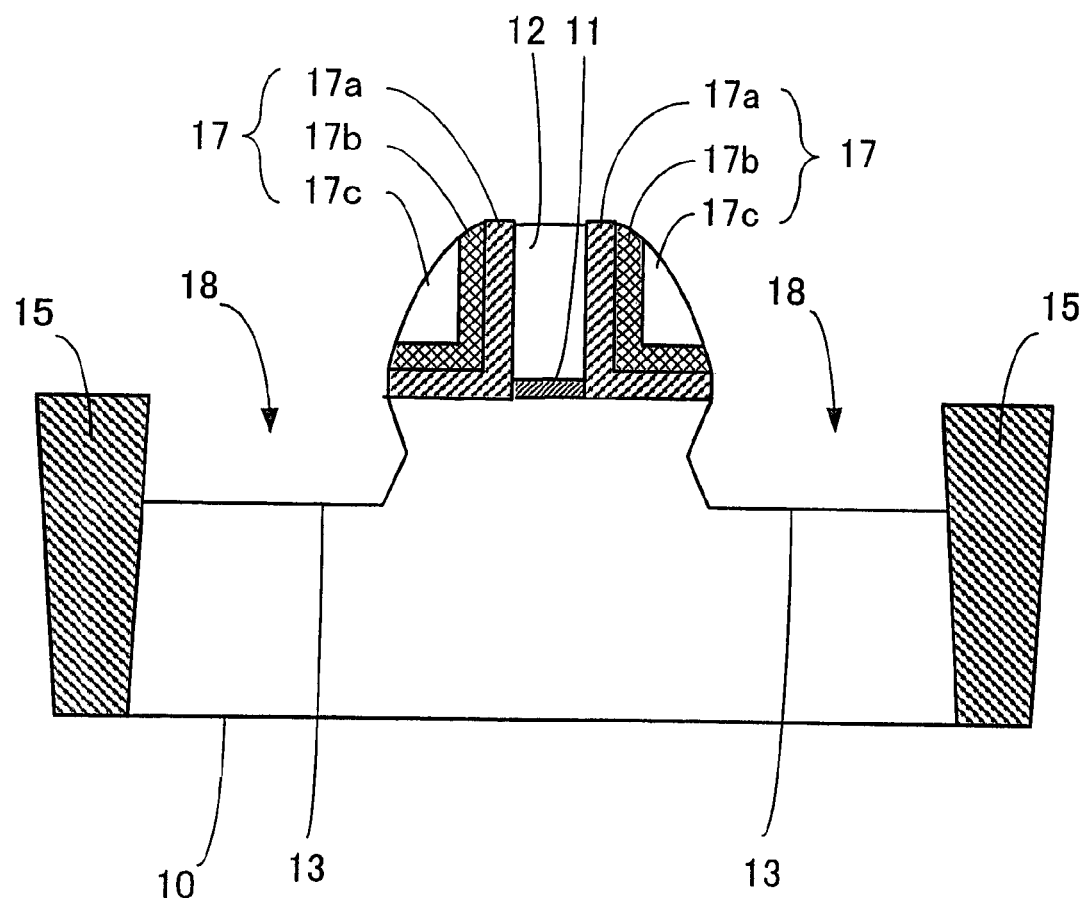
FIG. 7 is a sectional view showing an important part of the step of recessing the semiconductor substrate (part 1).

FIG. 7 is a sectional view showing an important part of the step of recessing the semiconductor substrate.

The Si substrate 10 is then recessed by etching to form recess regions 18. At this stage the surface in the recess regions 18 of the Si substrate 10 completely gets exposed. The depth of the recesses is 10 to 70 nm.

Figure 8:
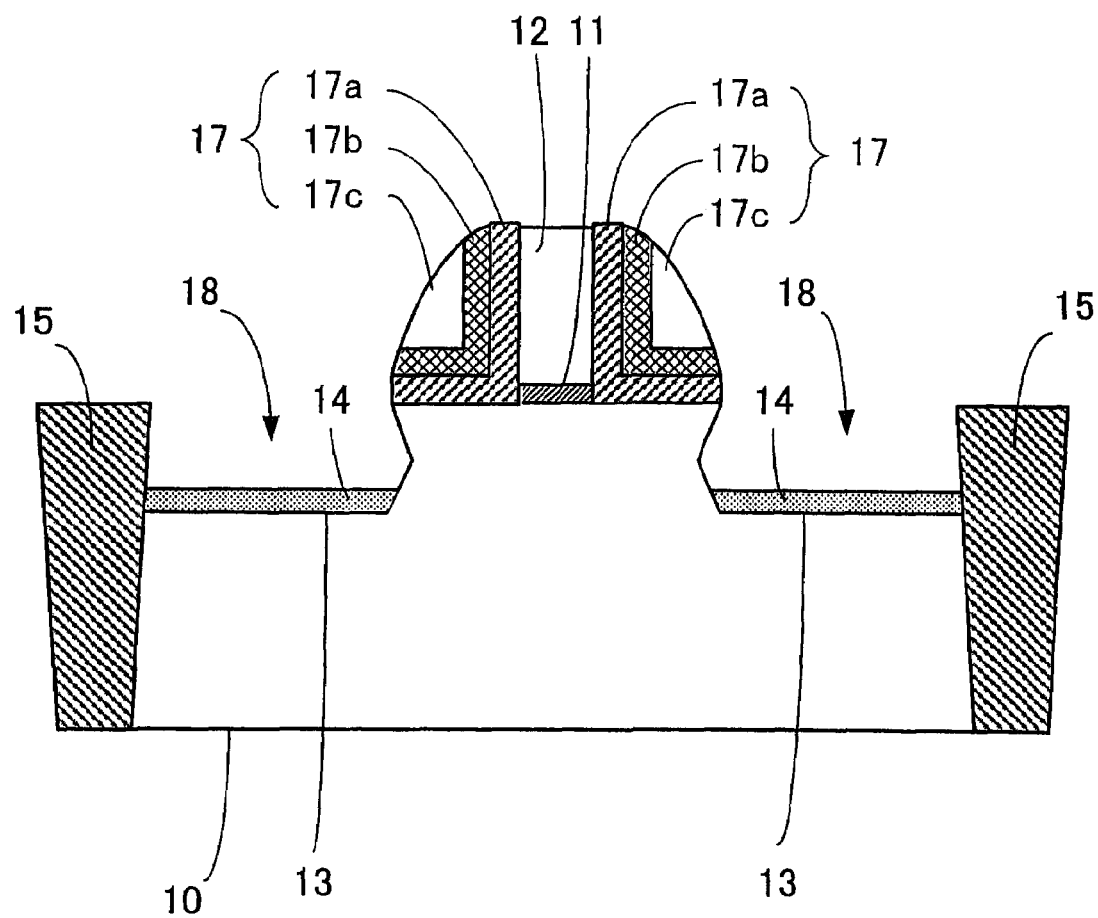
FIG. 8 is a sectional view showing an important part of the step of forming the source/drain electrodes (part 1).

FIG. 8 is a sectional view showing an important part of the step of forming the source/drain electrodes.

SiH$_4$—GeH$_4$—HCl—H$_2$ mixed gas is supplied to the recess regions 18 and onto the surface of the insulating layer 17 as a material for forming SiGe which is the second semiconductor layer. In this case, the total pressure of SiH$_4$—GeH$_4$—HCl—H$_2$ mixed gas is between 10 and 10,000 Pa.

When SiH$_4$—GeH$_4$—HCl—H$_2$ mixed gas reaches the surface of the Si substrate 10, SiH$_4$—GeH$_4$ decomposes and the SiGe layer 14 self-restrainingly epitaxial-grows on the Si substrate 10.

The silicon nitride film 17c contains Cl, so part of silicon bonds at the surface of the silicon nitride film 17c form the Si—Cl bond. Therefore, it is considered that SiH$_4$—GeH$_4$ is less apt to form a nucleus at the surface of the silicon nitride film 17c.

As a result, even when SiH$_4$—GeH$_4$ reaches the surface of the silicon nitride film 17c, it is easy for SiH$_4$—GeH$_4$ to go away from the surface of the silicon nitride film 17c in its original condition. That is to say, SiGe grows over the Si substrate 10 and SiGe is less apt to grow over the silicon nitride film 17c. As a result, there is a time difference between the beginning of the growth of SiGe over the Si substrate 10 and the silicon nitride film 17c. Accordingly, the SiGe layer 14 epitaxial-grows only in the recess regions 18 and the epitaxial growth of SiGe is suppressed over the insulating layer 17.

When SiH$_4$—GeH$_4$—HCl—H$_2$ mixed gas is supplied, the temperature of the Si substrate 10 should be set to 450 to 600° C. If the temperature of the Si substrate 10 is higher than 600° C., the influence of the thermal diffusion of impurities contained in the element in extremely small quantities becomes powerful. On the other hand, if the temperature of the Si substrate 10 is lower than 450° C., SiH$_4$ is less apt to decompose at the surface of the Si substrate 10. Therefore, SiGe does not epitaxial-grow over the Si substrate 10.

In the above descriptions SiH$_4$—GeH$_4$—HCl—H$_2$ mixed gas is used as a material for forming the SiGe layer 14. However, Si$_2$H$_6$ and digermane (Ge$_2$H$_6$) may be used in place of SiH$_4$ and GeH$_4$, respectively, as a material for forming the SiGe layer 14.

In addition, a material for forming the SiGe layer 14 may be mixed with, for example, B$_2$H$_6$ (diborane) as dopant gas. Even at a high boron (B) concentration (about 1E20 cm$^{-2}$), the electroactivity of boron incorporated in a film is about 100% and low resistivity can be realized. In this case, ion implantation and heat treatment performed after that for activation are unnecessary.

SiGe or germanium (Ge), which is also a semiconductor, may be used as the semiconductor substrate in place of silicon. Si or Ge may be used as the semiconductor layer, of which the source/drain electrodes are formed, in place of SiGe.

The supply of SiH$_4$—GeH$_4$—HCl—H$_2$ mixed gas is continued. When the thickness of the SiGe layer 14 reaches a predetermined value, the supply of SiH$_4$—GeH$_4$—HCl—H$_2$ mixed gas is terminated.

By doing so, the semiconductor device 100 in which the SiGe layer 14 is made to selectively epitaxial-grow on the Si substrate 10 shown in FIG. 1 can be fabricated. When the thickness of the SiGe layer 14 reaches 10 to 100 nm, the epitaxial growth is completed.

A process for fabricating a semiconductor device by using the selective epitaxial growth method, according to a second embodiment of the present invention will be described next. The semiconductor device shown in FIG. 2 is fabricated by this process.

The step of forming the gate electrode, the step of recessing the semiconductor substrate, and the step of forming the source/drain electrodes are the same as those described by using FIGS. 4, 7, and 8 respectively, so descriptions of them will be omitted. The step of forming the insulating layer on the sides of the gate electrode will be described first. Components in FIGS. 9 and 10 that are the same as those shown in FIGS. 4 through 8 are marked with the same symbols and detailed descriptions of them will be omitted.

Figure 9:
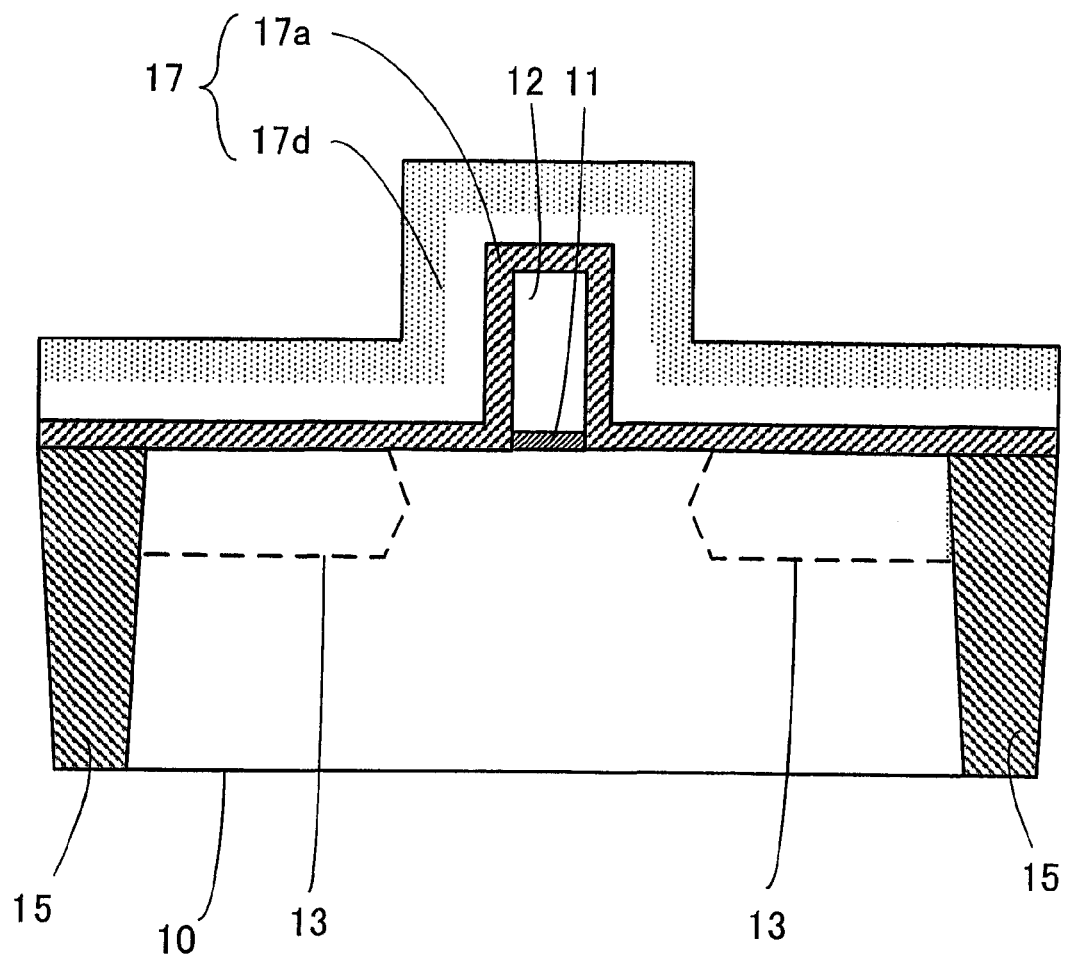
FIG. 9 is a sectional view showing an important part of the step of forming the insulating layer (part 2).

FIG. 9 is a sectional view showing an important part of the step of forming the insulating layer.

The silicon oxide film 17a with a thickness of 1 to 10 nm is formed over the Si substrate 10 and the gate electrode 12 by the CVD method.

The silicon nitride film 17d which contains Cl is then formed over the silicon oxide film 17a by the CVD method. SiH$_2$Cl$_2$—NH$_3$ mixed gas is used as a material for forming the silicon nitride film 17d.

The silicon nitride film 17d is formed so that the chlorine content of the silicon nitride film 17d will gradually increase from the interface between the silicon oxide film 17a and the silicon nitride film 17d to the surface of the silicon nitride film 17d, that is to say, so that the chlorine content of a surface portion of the silicon nitride film 17d will be higher than the chlorine content of the inside of the silicon nitride film 17d. To be concrete, the silicon nitride film 17d is formed by gradually raising the ratio of an SiH$_2$Cl$_2$ flow rate to an NH$_3$ flow rate in the range of 0.05 to 10. At this time the temperature of the Si substrate 10 is 550 to 850° C.

Alternatively, the silicon nitride film 17d is formed by gradually lowering the temperature of the Si substrate 10 in the range of 550 to 850° C. at the time of supplying SiH$_2$Cl$_2$—NH$_3$ mixed gas. By lowering the temperature of the Si substrate 10 at the time of supplying SiH$_2$Cl$_2$—NH$_3$ mixed gas, the Si—Cl bond of an SiH$_2$Cl$_2$ molecule becomes less apt to decompose and dissociate. As a result, the amount of Cl incorporated in a film increases.

Gas obtained by mixing SiH$_3$Cl, SiHCl$_3$, SiCl$_4$, or the like with NH$_3$ or N$_2$H$_4$ may be used as chlorosilane-based material gas for forming the silicon nitride film 17d which contains Cl.

The thickness of the silicon nitride film 17d formed is 10 to 60 nm. The chlorine content near the surface of the silicon nitride film 17d is $5 \times 10^{19}$ to $5 \times 10^{21}$ atoms/cm$^3$.

Figure 10:
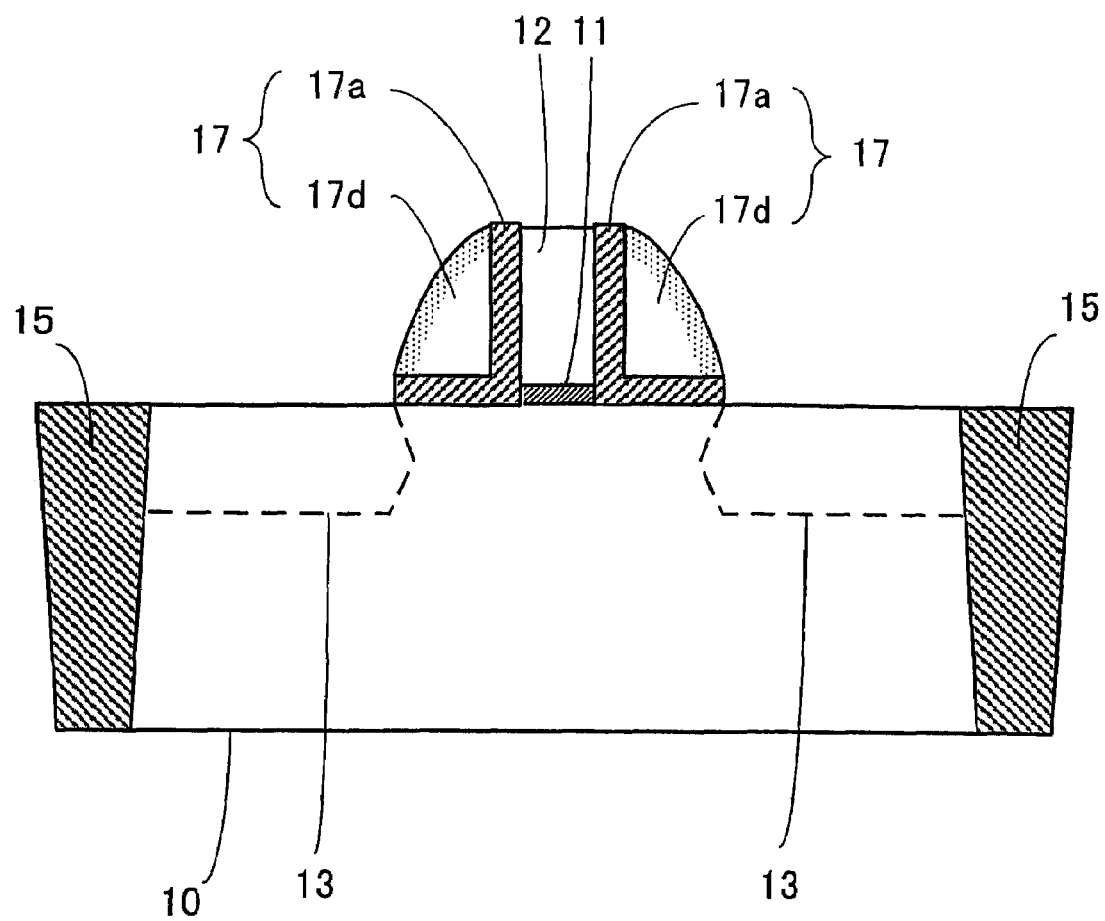
FIG. 10 is a sectional view showing an important part of the step of forming the side walls (part 2).

FIG. 10 is a sectional view showing an important part of the step of forming the side walls.

The silicon oxide film 17a and the silicon nitride film 17d formed in the preceding step are etched so that the silicon oxide film 17a and the silicon nitride film 17d will become the side walls of the gate electrode 12.

As a result, the insulating layer 17 made up of the silicon oxide film 17a and the silicon nitride film 17d is formed on the sides of the gate electrode 12 as the side walls.

The surface in the source/drain regions 13 of the Si substrate 10 completely gets exposed as a result of the above etching.

Figure 22:
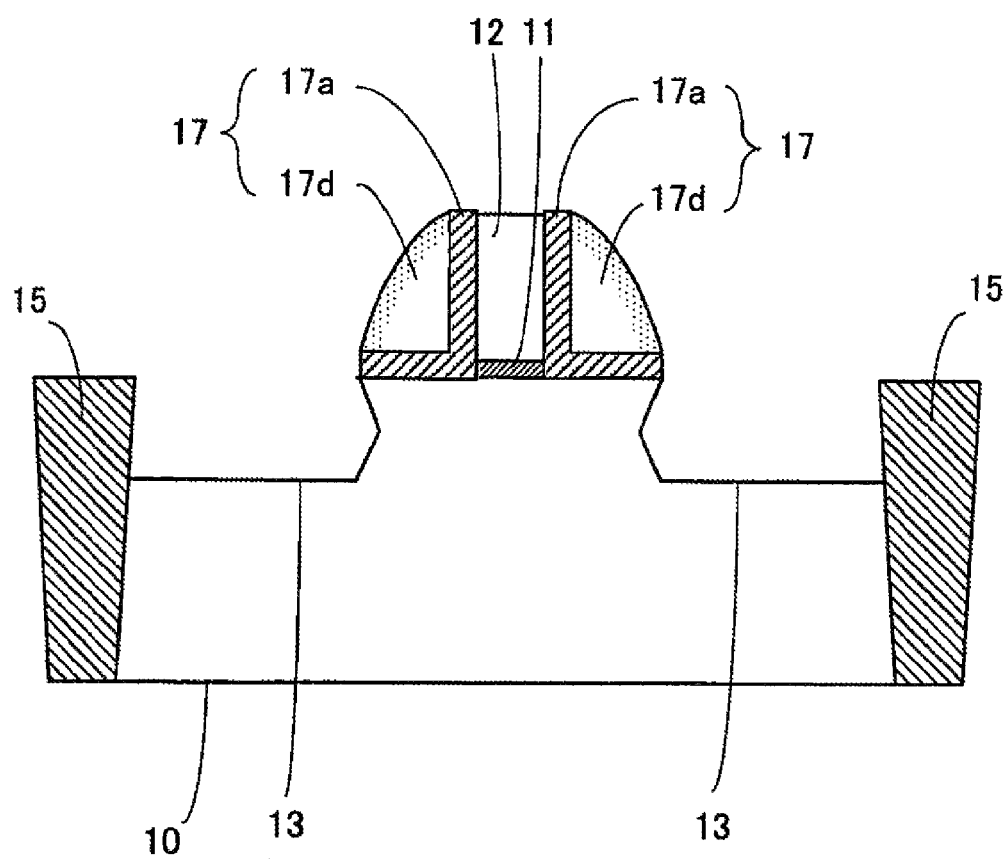
FIG. 22 is a section view showing a part of the step of recessing the semiconductor substrate.
Figure 23:
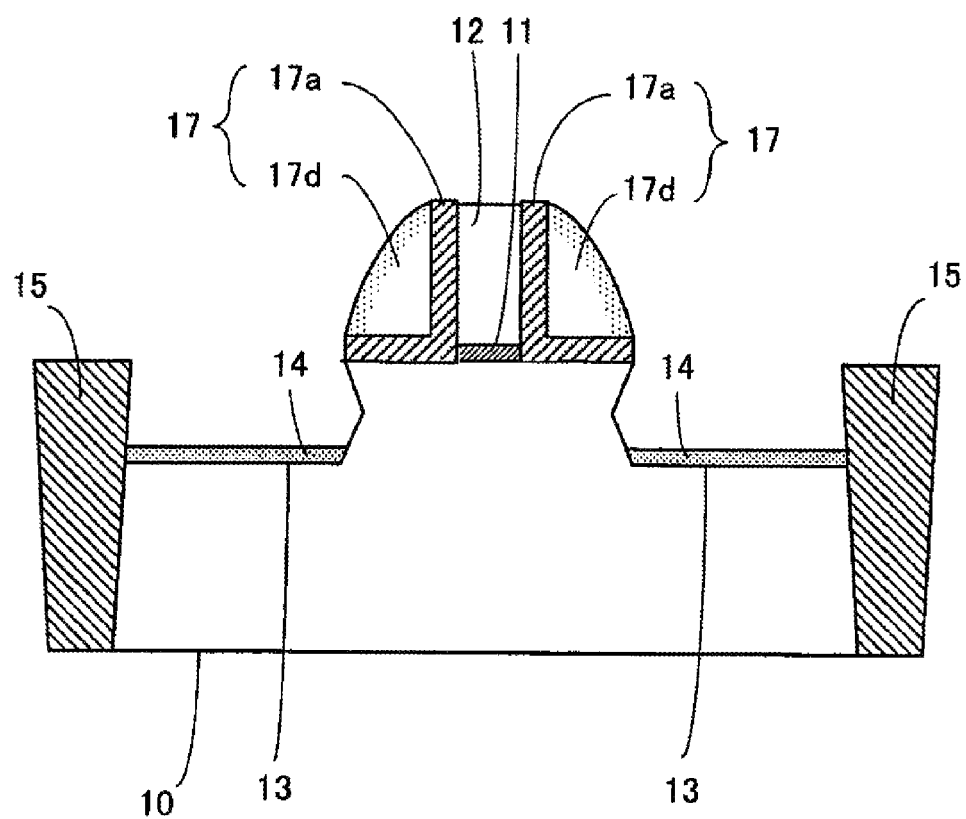
FIG. 23 is a section view showing a part of the step of forming the source/drain electrode.

In the following steps, the source/drain regions 13 of the Si substrate 10 are recessed (FIG. 22) and the SiGe layer 14 is made to selectively epitaxial-grow on the Si substrate 10 recessed (FIG. 23). In this case, the same method that is described above is used.

By doing so, the semiconductor device 200 in which the SiGe layer 14 is made to selectively epitaxial-grow on the Si substrate 10 shown in FIG. 2 can be fabricated. When the thickness of the SiGe layer 14 reaches 10 to 100 nm, the epitaxial growth is completed.

To fabricate an elevated source/drain MOSFET, the step of recessing an Si substrate 10 is omitted. That is to say, after the step of forming the side walls shown in FIG. 6 or 10, an SiGe layer 14 is made to selectively epitaxial-grow over the Si substrate 10. By doing so, the elevated source/drain MOSFET can be fabricated by using the selective epitaxial growth method.

As has been described in the foregoing, with the above semiconductor device fabrication methods the gate electrode 12 is formed over the Si substrate 10 which is a semiconductor substrate with the gate insulating film 11 therebetween, the insulating layer 17 which contains a halogen element is formed on the sides of the gate electrode 12, a material for forming a semiconductor layer is supplied onto the Si substrate 10 and the insulating layer 17 which contains a halogen element, the semiconductor layer is made to epitaxial-grow over the Si substrate 10 with high selectivity, and the SiGe layer 14 which serves as the source/drain electrodes is formed.

As a result, an OFF-state leakage current which flows between, for example, the gate electrode 12 and the source/drain regions 13 is suppressed and a manufacturing process suitable for actual mass production is established.

In the above descriptions the insulating layer which serves as the side walls of the MOS transistor contains Cl. By doing so, the growth of an SiGe layer is suppressed. However, the present invention is not limited to the improvement of selectivity between an insulating layer which serves as side walls and an Si substrate.

For example, an insulating layer which serves as the isolation regions 15 shown in FIG. 1 or 2 may also contain Cl. By doing so, selectivity between the isolation regions 15 and the Si substrate 10 can be improved. As a result, in a semiconductor device fabricated by using the selective epitaxial growth method, insulation between source/drain electrodes included in adjacent MOS transistors can be improved.

In the above descriptions the silicon nitride film contains Cl. However, the silicon nitride film may contain bromine (Br) which is another halogen element in place of Cl.

An effect obtained in the case of a silicon nitride film containing Cl will now be described. To check this effect, several mimic samples on which silicon nitride films differ from one another in composition were prepared and the difference in the growth of SiGe on these samples was examined.

Three samples A, B, and C were prepared first for preliminary examination. An Si wafer is used as a substrate of each sample and a CVD-silicon nitride film is formed in advance on the wafer.

$Si_2H_6$—$NH_3$ mixed gas is used as a material for forming each CVD-silicon nitride film. To change the silicon and nitrogen contents of these samples, the CVD-silicon nitride films are formed at different ratios of an $Si_2H_6$ flow rate to an $NH_3$ flow rate. The ratio of an $Si_2H_6$ flow rate to an $NH_3$ flow rate is the highest for sample A and is the lowest for sample C. The ratio of an $Si_2H_6$ flow rate to an $NH_3$ flow rate is in the range of 0.05 to 10. While each CVD-silicon nitride film is being formed, pressure is lower than or equal to 5.7 Pa. When $Si_2H_6$—$NH_3$ mixed gas is supplied, the temperature of each Si wafer is 550 to 850° C.

The ratio of Si atoms to N atoms contained in a CVD-silicon nitride film of each sample is calculated by X-ray photoelectron spectroscopy (XPS). The ratios of Si atoms to N atoms are 1.06, 0.99, and 0.92 for samples A, B, and C respectively.

By supplying $SiH_4$—$GeH_4$—HCl—$H_2$ mixed gas onto the CVD-silicon nitride films in these samples, SiGe is then made to grow. When $SiH_4$—$GeH_4$—HCl—$H_2$ mixed gas is supplied, the temperature of each Si wafer is 450 to 600° C.

Figure 11:
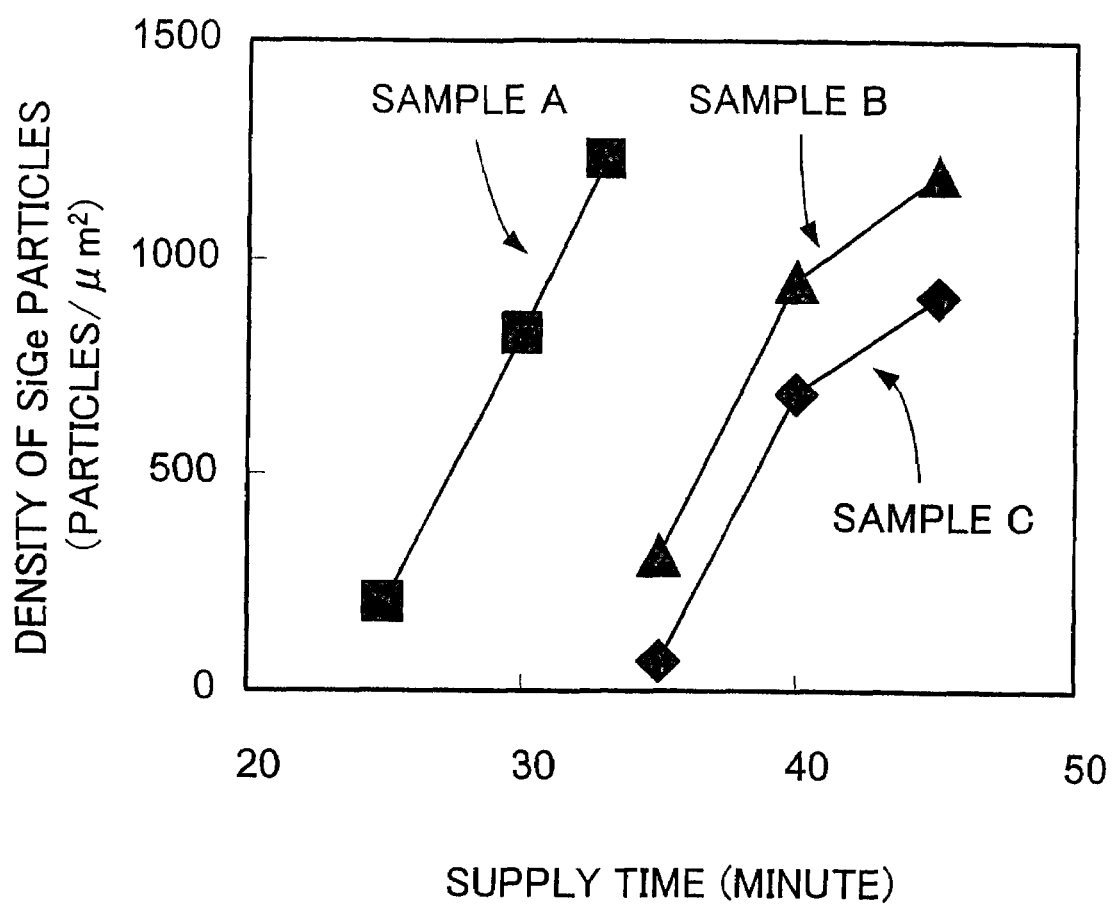
FIG. 11 is a view for describing the differences in the growth of SiGe on silicon nitride films.

FIG. 11 is a view for describing the differences in the growth of SiGe on the silicon nitride films.

In FIG. 11, a horizontal axis indicates time (minutes) for which mixed gas is supplied, and a vertical axis indicates the density of SiGe particles (particles/$\mu m^2$). The density of SiGe particles is counted directly on scanning electron microscope (SEM) images.

As a result, it turns out that an increase in the density of SiGe particles of sample A is the largest and that an increase in the density of SiGe particles of sample C is the smallest. That is to say, it turns out that even if mixed gas is supplied for the same time, a sample having a higher silicon content has a higher density of SiGe particles.

The likely reason for this is that as the silicon content of a CVD-silicon nitride film increases, the number of nucleus formation sites for the growth of SiGe increases on its surface. That is to say, there is a possibility that by eliminating these sites by some element, the growth of SiGe can be suppressed.

The difference in the growth of SiGe on silicon nitride films which contain Cl was examined next.

Three samples D, E, and F were prepared for this examination. An Si wafer is used as a substrate of each sample and a CVD-silicon nitride film which contains Cl is formed in advance on the wafer by the CVD method.

$SiH_2Cl_2$—$NH_3$ mixed gas is used as a material for forming each CVD-silicon nitride film which contains Cl. To change the silicon, nitrogen, and chlorine contents of these samples, the CVD-silicon nitride films which contain Cl are formed at different ratios of an $SiH_2Cl_2$ flow rate to an $NH_3$ flow rate. The ratio of an $SiH_2Cl_2$ flow rate to an $NH_3$ flow rate is in the range of 0.05 to 10. While each CVD-silicon nitride film is being formed, pressure is lower than or equal to 5.7 Pa. When $SiH_2Cl_2$—$NH_3$ mixed gas is supplied, the temperature of each Si wafer is 550 to 850° C.

The ratio of Si atoms to N atoms contained in a CVD-silicon nitride film of each sample is calculated by XPS. The ratios of Si atoms to N atoms are 0.74, 0.77, and 0.79 for samples D, E, and F respectively.

In addition, the chlorine content of each sample is calculated by total reflection X-ray fluorescence analysis and the following results are obtained.

Figure 12:
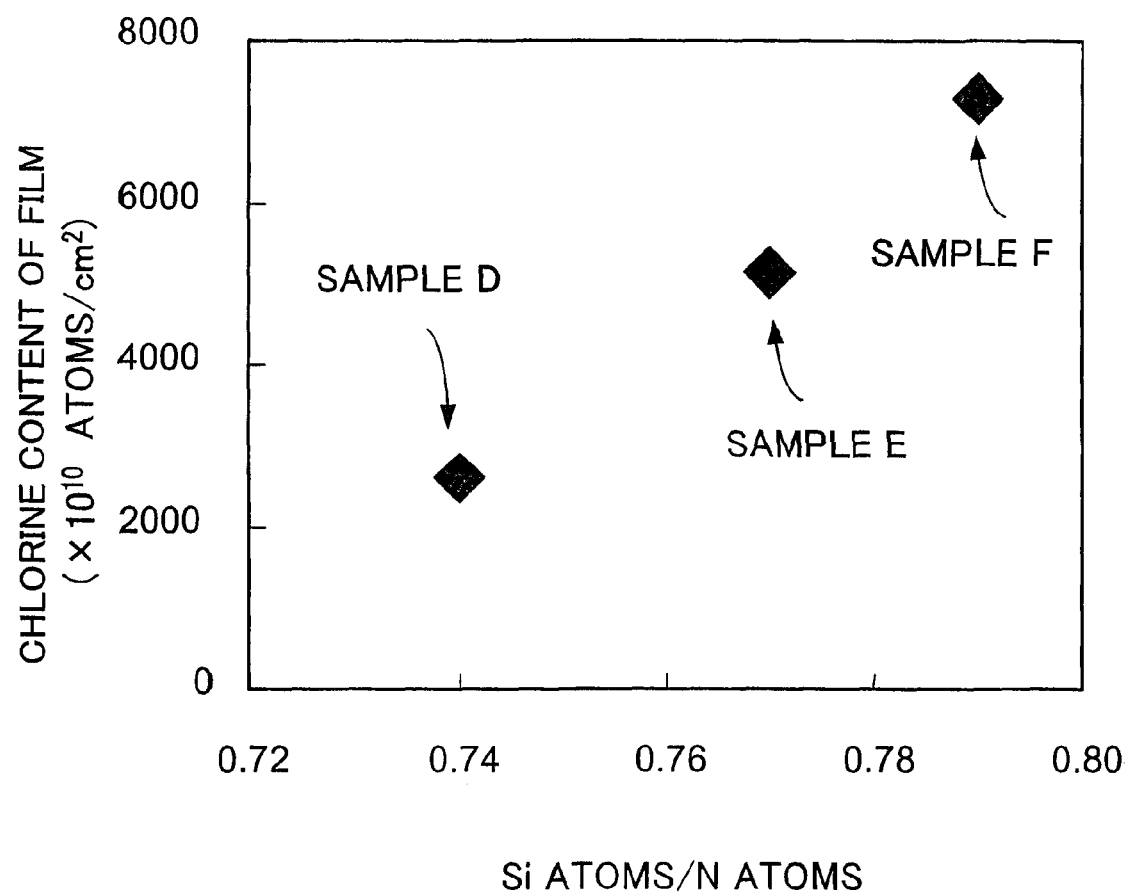
FIG. 12 is a view for describing the relationship between the ratio of Si atoms to N atoms and chlorine content.

FIG. 12 is a view for describing the relationship between the ratio of Si atoms to N atoms and chlorine content.

In FIG. 12, a vertical axis indicates the ratio of Si atoms to N atoms and a horizontal axis indicates the chlorine content (atoms/cm$^2$) of each sample.

As shown in FIG. 12, it turns out that a sample having a higher ratio of Si atoms to N atoms has a higher chlorine content. In particular it turns out that sample F has three times the chlorine content of sample D. That is to say, it turns out that when a silicon nitride film which contains Cl is formed by using $SiH_2Cl_2$—$NH_3$ mixed gas as a material, the chlorine content can be set to a predetermined value by varying the ratio of an $SiH_2Cl_2$ flow rate to an $NH_3$ flow rate.

The results of the growth of SiGe realized by supplying $SiH_4$—$GeH_4$—$HCl$—$H_2$ mixed gas onto samples D, E, and F will now be described. When $SiH_4$—$GeH_4$—$HCl$—$H_2$ mixed gas is supplied, the temperature of each Si wafer is 450 to 600° C.

Figure 13:
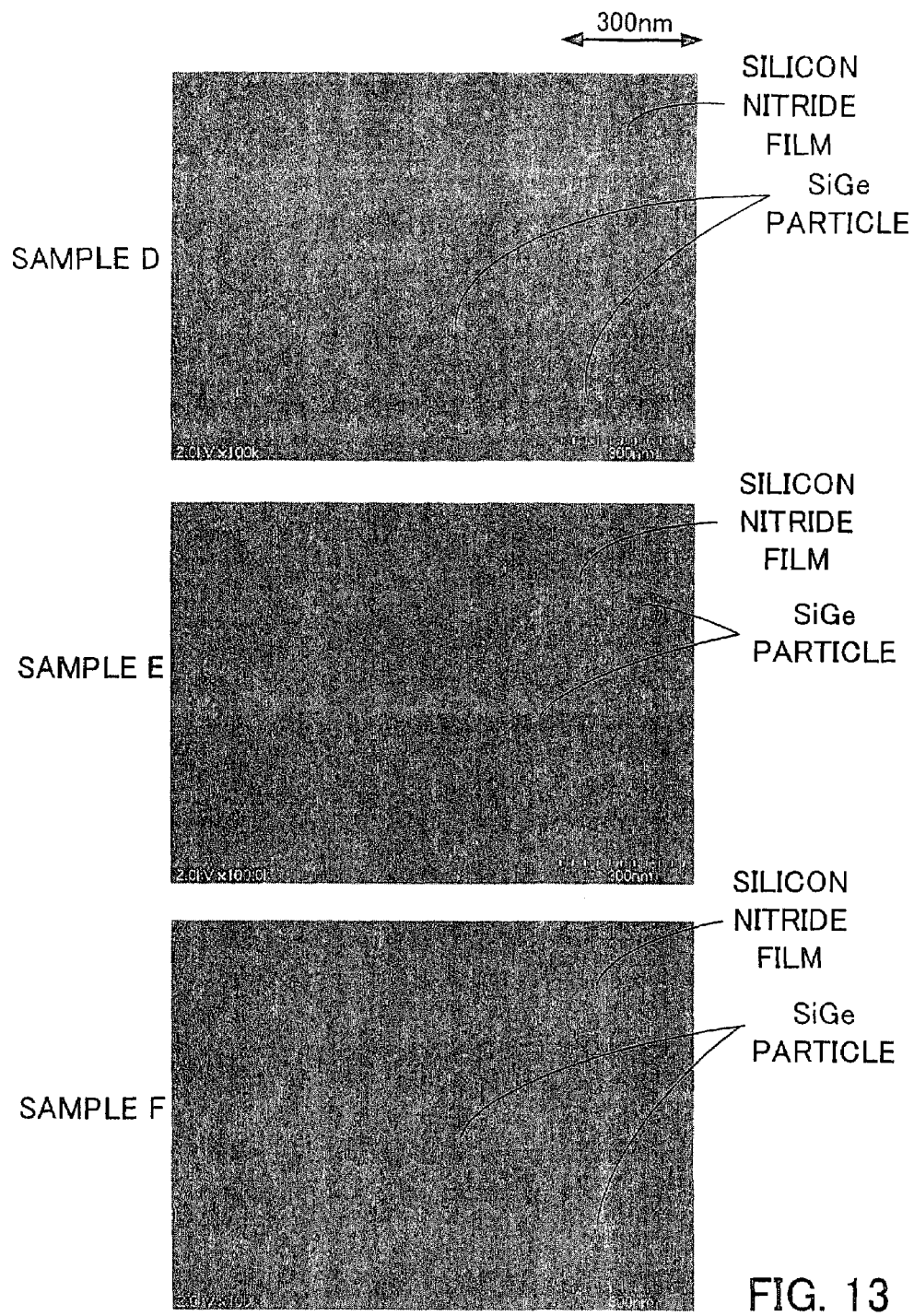
FIG. 13 shows SEM images for describing the difference in the growth of SiGe on silicon nitride films which contain Cl.

FIG. 13 shows SEM images for describing the difference in the growth of SiGe on the silicon nitride films which contain Cl.

Each SEM image shows the surface of a sample in the case of supplying $SiH_4$—$GeH_4$—$HCl$—$H_2$ mixed gas for 80 minutes. In each SEM image, each substance which looks like a white grain is an SiGe particle and a black portion is a silicon nitride film beneath SiGe particles.

These SEM images show that the density of SiGe particles which grow on the silicon nitride film of sample D is the highest, that the density of SiGe particles which grow on the silicon nitride film of sample E is lower than that of the SiGe particles which grow on the silicon nitride film of sample D, and that the density of SiGe particles which grow on the silicon nitride film of sample F is the lowest.

Figure 14:
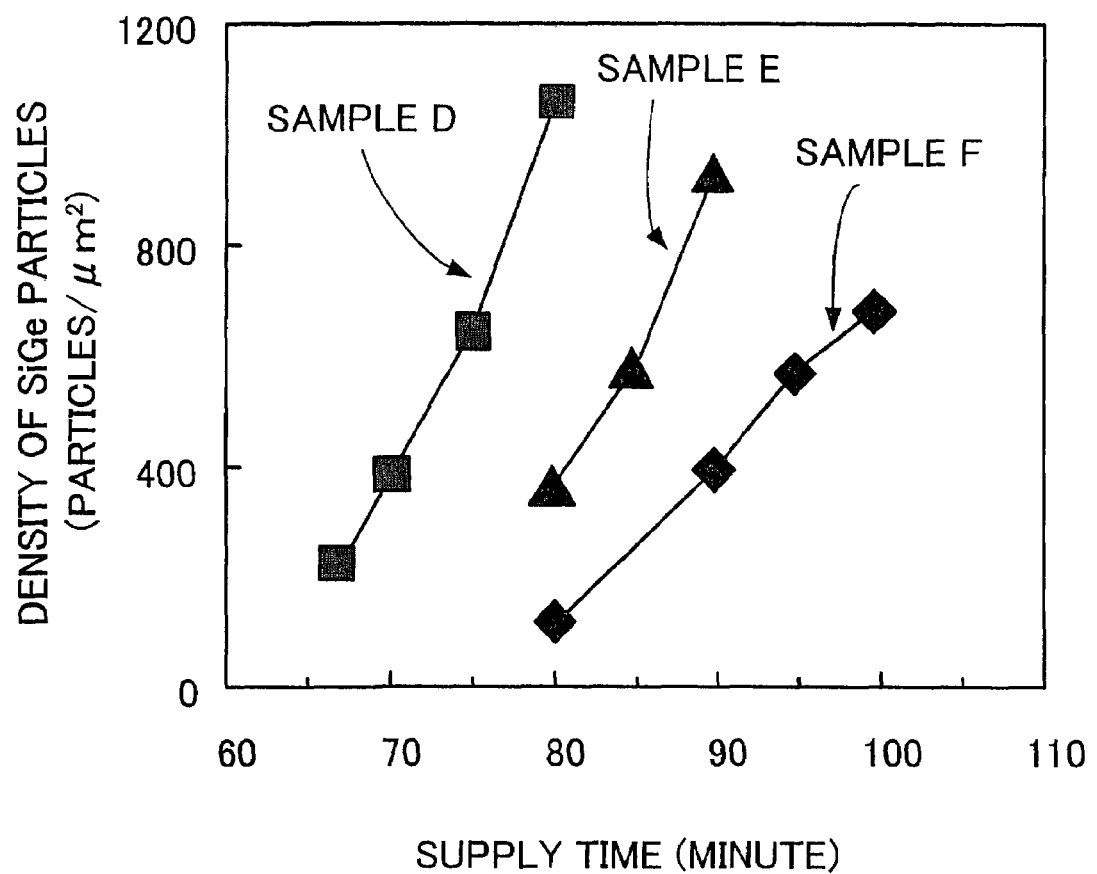
FIG. 14 is a view for describing the differences in the growth of SiGe on silicon nitride films which contain Cl.

FIG. 14 is a view for describing the differences in the growth of SiGe on the silicon nitride films which contain Cl.

In FIG. 14, a horizontal axis indicates time (minutes) for which $SiH_4$—$GeH_4$—$HCl$—$H_2$ mixed gas is supplied, and a vertical axis indicates the density of SiGe particles (particles/$\mu m^2$) which grow on the silicon nitride films which contain Cl. The density of SiGe particles is counted directly on the SEM images.

As a result, it turns out that as time for which $SiH_4$—$GeH_4$—$HCl$—$H_2$ mixed gas is supplied becomes longer, the density of SiGe particles on each sample increases and that as time for which $SiH_4$—$GeH_4$—$HCl$—$H_2$ mixed gas is supplied becomes longer, the differences in the density of SiGe particles among samples D, E, and F grow.

As stated above, the chlorine content of the silicon nitride film of sample D is the lowest and the chlorine content of the silicon nitride film of sample F is the highest. This can be seen from the results shown in FIG. 12.

The results shown in FIG. 14 show that an increase in the density of SiGe particles on sample F the chlorine content of which is the highest is the smallest.

By the way, sample F has three times the chlorine content of sample D. At the time when $SiH_4$—$GeH_4$—$HCl$—$H_2$ mixed gas is supplied for, for example, 80 minutes, the density of the SiGe particles on sample F is compared with the density of the SiGe particles on sample D. As a result, it turns out that though sample F has only three times the chlorine content of sample D, the density of the SiGe particles on sample F decreases to a tenth of the density of the SiGe particles on sample D.

That is to say, it turns out that the growth of SiGe particles can be suppressed significantly on a silicon nitride film which contains Cl. As a result, an OFF-state leakage current which flows between, for example, the source/drain regions 13 and the gate electrode 12 is suppressed and a manufacturing process suitable for actual mass production can be established.

A process for fabricating a semiconductor device by using the selective epitaxial growth method, according to a third embodiment of the present invention will be now described. In this embodiment, pretreatment which can promote selective epitaxial growth further will be described. The basic principles of the pretreatment will be described first.

Figure 15:
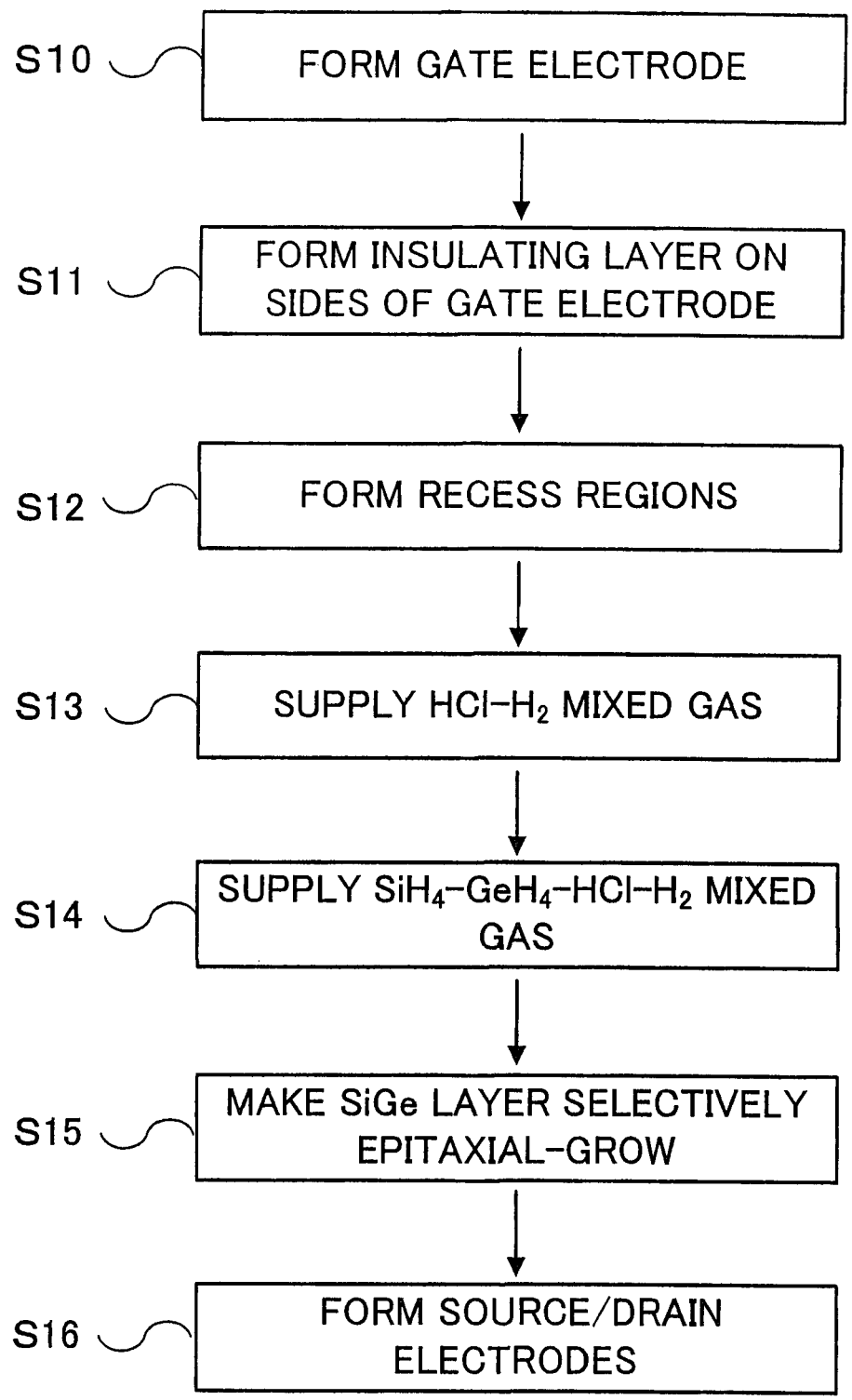
FIG. 15 is an example of a flow chart of pretreatment for fabricating a semiconductor device by using selective epitaxial growth.

FIG. 15 is an example of a flow chart of pretreatment for fabricating a semiconductor device by using selective epitaxial growth. First, an Si substrate is used as a first semiconductor layer and a gate electrode is formed over the Si substrate (step S10). An insulating layer which serves as side walls is then formed on the sides of the gate electrode (step S11). At this stage the insulating layer 17 which is shown in FIG. 1 or 2 and which contains a halogen element may be formed. After that, portions in the Si substrate where source/drain electrodes are to be formed are etched to form recess regions (step S12). A material, such as $HCl$—$H_2$ mixed gas, for suppressing epitaxial growth on the insulating layer is then supplied onto the recess regions of the Si substrate and the insulating layer which serves as the side walls (step S13). After that, gas, such as $SiH_4$—$GeH_4$—$HCl$—$H_2$ mixed gas, used for forming a second semiconductor layer is supplied (step S14). By doing so, an SiGe layer, being the second semiconductor layer, is made to selectively epitaxial-grow in the recess regions (step S15), and the source/drain electrodes of the SiGe layer with predetermined thickness are formed (step S16).

As stated above, by supplying a material, such as HCl, for suppressing epitaxial growth on the insulating layer onto the Si substrate in which the recess regions have been formed and the insulating layer which serves as the side walls, dangling bonds on the surface of the insulating layer are eliminated by Cl radicals. As a result, the growth of SiGe is suppressed over the insulating layer and the SiGe layer selectively epitaxial-grows over the Si substrate.

To fabricate an elevated source/drain MOSFET, the above step S12 is omitted and step S13 is performed after step S11. By doing so, an SiGe layer is made to selectively epitaxial-grow over an Si substrate.

Before step S13 is performed, an oxide film formed on the Si substrate recessed may be removed by a 1 to 10% wt solution of hydrofluoric acid.

Figure 17:
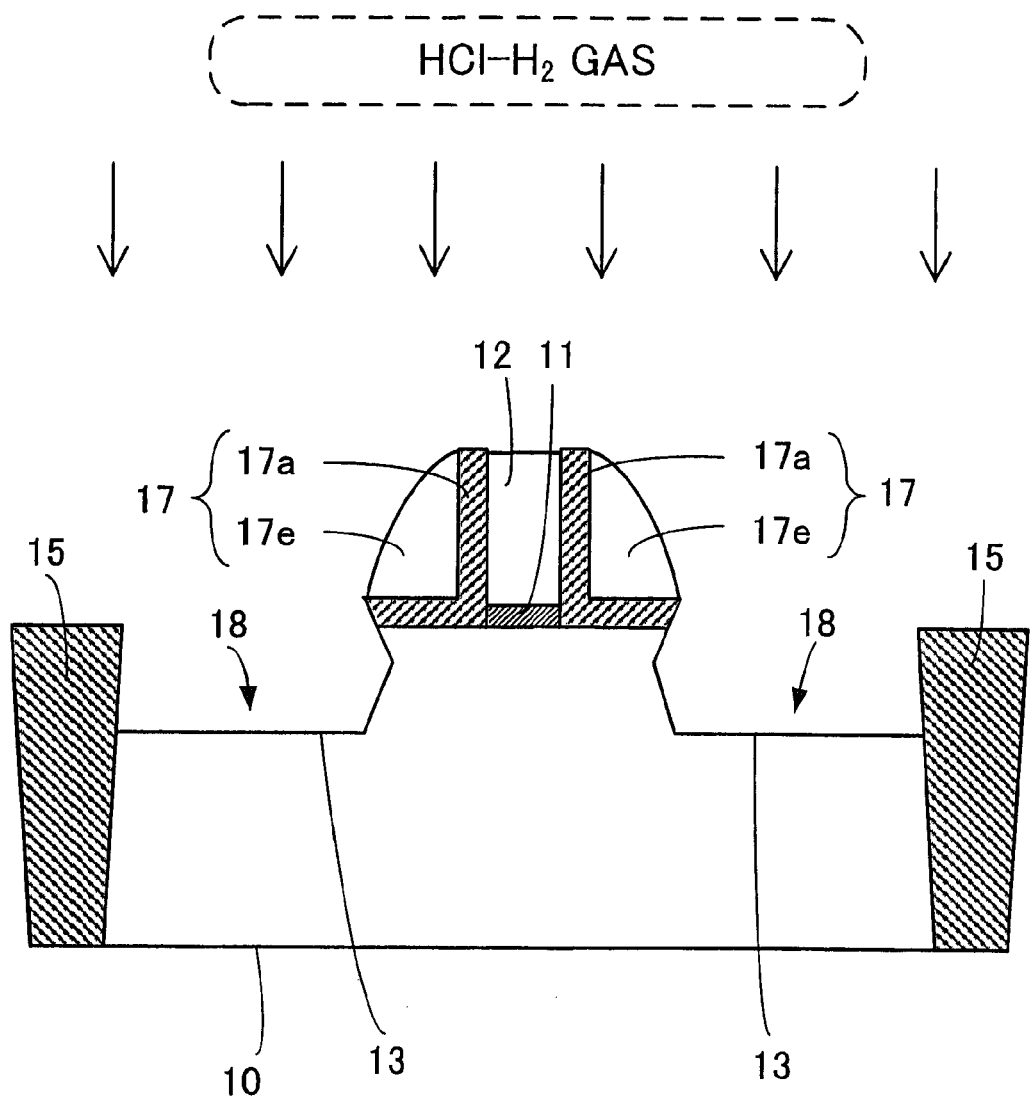
FIG. 17 is a sectional view showing an important part of the step of supplying HCl—$H_2$ mixed gas.
Figure 18:
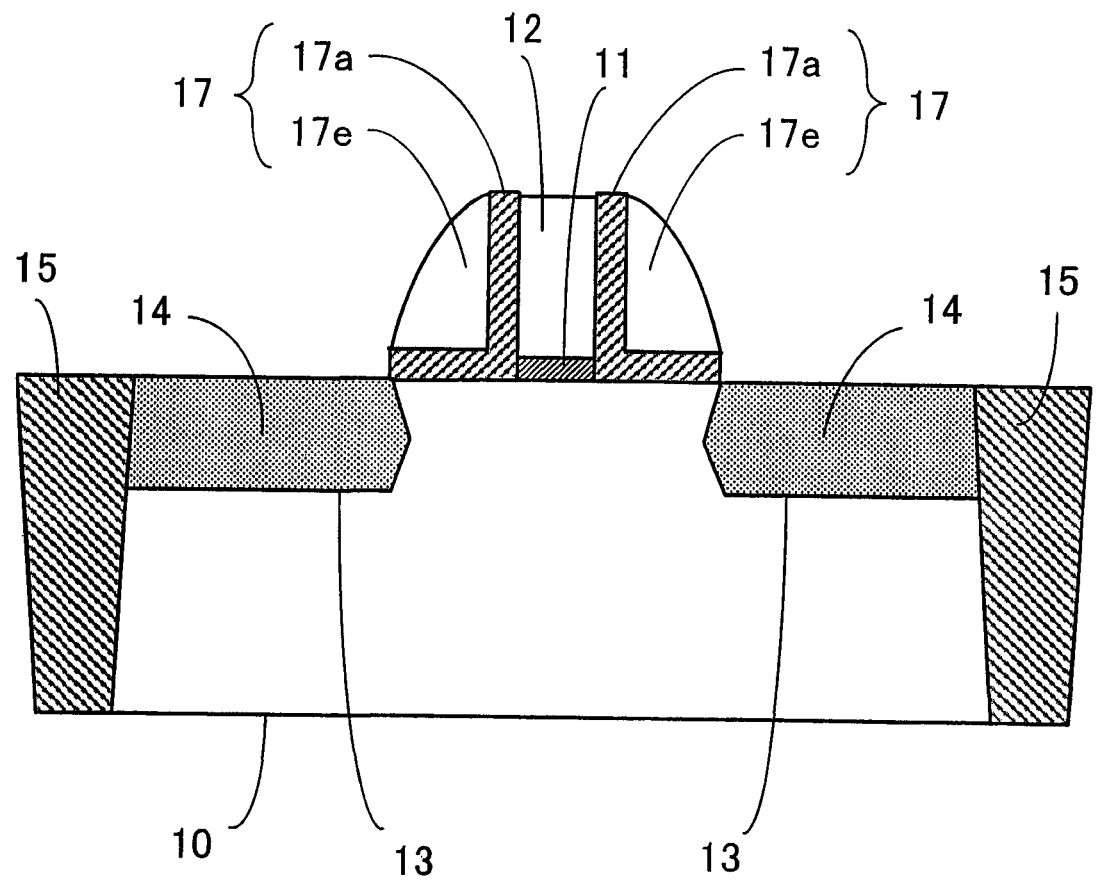
FIG. 18 is a sectional view showing an important part of the step of forming the source/drain electrodes (part 2).

Each fabrication step will now be described concretely. Each of FIGS. 16 through 18 is a sectional view showing an important part of the step of making a SiGe layer selectively epitaxial-grow in recess regions of a semiconductor substrate with a process for fabricating a recessed source/drain MOSFET as an example.

Figure 16:
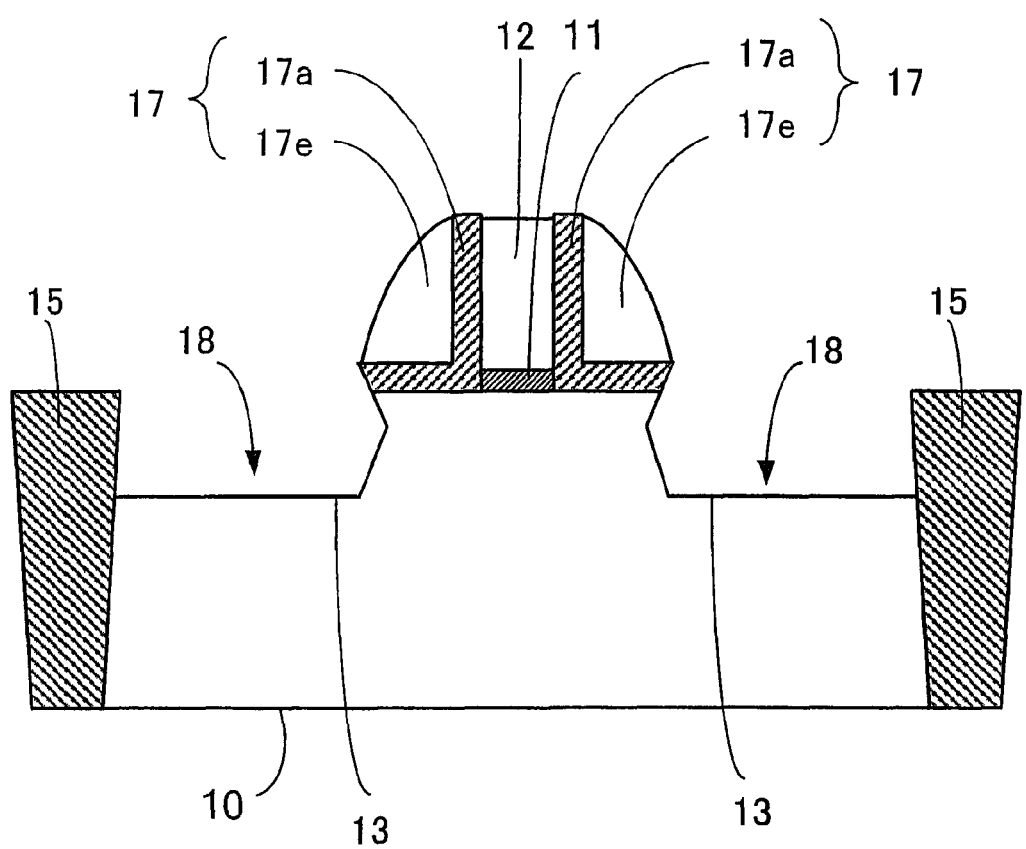
FIG. 16 is a sectional view showing an important part of the step of recessing the semiconductor substrate (part 2).

FIG. 16 is a sectional view showing an important part of the step of recessing the semiconductor substrate.

The Si substrate 10 is used as a semiconductor substrate, being a first semiconductor layer. The gate electrode 12 is formed over the Si substrate 10 with the gate insulating film 11 therebetween. The insulating layer 17 which serves as side walls and which includes the silicon oxide film 17a and a silicon nitride film 17e deposited by, for example, the CVD method is formed on both sides of the gate electrode 12. The recess regions 18 are formed in the Si substrate 10 by etching. At this stage the surface in the recess regions 18 of the Si substrate 10 and the surface of the insulating layer 17 are exposed.

The silicon nitride film 17b and the silicon nitride film 17c which contains Cl (shown in FIG. 1) or the silicon nitride film 17d which contains Cl (shown in FIG. 2) may be formed in place of the silicon nitride film 17e.

FIG. 17 is a sectional view showing an important part of the step of supplying HCl—$H_2$ mixed gas.

HCl—$H_2$ mixed gas is supplied onto the surface of the Si substrate 10 recessed by the etching and the surface of the insulating layer 17 to expose the surface of the Si substrate 10 and the surface of the insulating layer 17 to HCl. In this case, $H_2$ is carrier gas for HCl.

The temperature of the Si substrate 10 onto which HCl—$H_2$ mixed gas is supplied should be set to 450 to 600° C. If the temperature of the Si substrate 10 is higher than 600° C., the influence of the thermal diffusion of impurities contained in the element in extremely small quantities becomes powerful. On the other hand, if the temperature of the Si substrate 10 is lower than 450° C., HCl does not decompose well on the surface of the insulating layer 17. Therefore, it is difficult to eliminate dangling bonds on the surface of the insulating layer 17 by Cl radicals. HCl—$H_2$ mixed gas is supplied for 1 to 10 minutes.

FIG. 18 is a sectional view showing an important part of the step of forming the source/drain electrodes.

After the surface of the Si substrate 10 recessed and the surface of the insulating layer 17 are exposed to HCl—$H_2$ mixed gas in the above way, gas, such as $SiH_4$—$GeH_4$—HCl—$H_2$ mixed gas, used for forming a second semiconductor (SiGe) layer is supplied onto the surface of the Si substrate 10 and the surface of the insulating layer 17.

When $SiH_4$—$GeH_4$ reaches the surface of the Si substrate 10, $SiH_4$—$GeH_4$ decomposes and an SiGe layer 14 self-restrainingly epitaxial-grows on the surface of the Si substrate 10.

On the other hand, electrons are not supplied to the surface of the insulating layer 17. Therefore, even when $SiH_4$—$GeH_4$ reaches the surface of the insulating layer 17, $SiH_4$—$GeH_4$ is less apt to decompose. HCl is supplied in the preceding step, so dangling bonds which are exposed on the surface of the insulating layer 17 are eliminated by, for example, Cl radicals. Accordingly, it is easy for $SiH_4$—$GeH_4$ which reaches the surface of the insulating layer 17 to go away from the surface of the insulating layer 17 in its original condition. That is to say, SiGe grows on the Si substrate 10 and SiGe is less apt to grow on the insulating layer 17. As a result, there is a time difference between the beginning of the growth of SiGe on the Si substrate 10 and the insulating layer 17 and the epitaxial growth of SiGe is suppressed on the insulating layer 17.

The supply of $SiH_4$—$GeH_4$—HCl—$H_2$ mixed gas is continued. When the thickness of the SiGe layer 14 reaches a predetermined value, the supply of $SiH_4$—$GeH_4$—HCl—$H_2$ mixed gas is terminated. By doing so, the SiGe layer 14 is formed on the Si substrate 10.

To fabricate an elevated source/drain MOSFET, the step of recessing an Si substrate 10 shown in FIG. 16 is omitted. That is to say, after the step of forming side walls on sides of a gate electrode 12, an SiGe layer 14 is made to selectively epitaxial-grow over the Si substrate 10. By doing so, the elevated source/drain MOSFET can be fabricated by using the selective epitaxial growth method.

By following the above steps, the SiGe layer 14, being the second semiconductor layer, can be made to selectively epitaxial-grow on the Si substrate 10, being the first semiconductor layer.

At this time the temperature of the Si substrate 10 should be set to 450 to 600° C. If the temperature of the Si substrate 10 is higher than 600° C., the influence of the thermal diffusion of impurities contained in the element in extremely small quantities becomes powerful. On the other hand, if the temperature of the Si substrate 10 is lower than 450° C., $SiH_4$ is less apt to decompose on the surface of the Si substrate 10. Therefore, SiGe does not epitaxial-grow on the Si substrate 10.

The effect of suppressing the growth of SiGe by exposing an insulating layer to HCl—$H_2$ mixed gas will now be described. Each sample used for checking this effect is obtained by making a CVD-silicon nitride film grow on the surface of a wafer. The difference between an effect obtained in the case where the surface of a silicon nitride film is exposed to HCl—$H_2$ mixed gas and an effect obtained in the case where the surface of a silicon nitride film is not exposed to HCl—$H_2$ mixed gas will be described. In this case, the total pressure of HCl—$H_2$ mixed gas is 10 Pa.

Two samples G and H were prepared. Sample G was prepared in the following way. The surface of a silicon nitride film is not exposed to HCl—$H_2$ mixed gas before the supply of $SiH_4$—$GeH_4$—HCl—$H_2$ mixed gas. $SiH_4$—$GeH_4$—HCl—$H_2$ mixed gas is supplied onto the silicon nitride film. Sample H was prepared in the following way. The surface of a silicon nitride film is exposed to HCl—$H_2$ mixed gas before the supply of $SiH_4$—$GeH_4$—HCl—$H_2$ mixed gas. $SiH_4$—$GeH_4$—HCl—$H_2$ mixed gas is then supplied directly onto the silicon nitride film. With samples G and H, $SiH_4$—$GeH_4$—HCl—$H_2$ mixed gas is supplied for 60 minutes.

Figure 19:
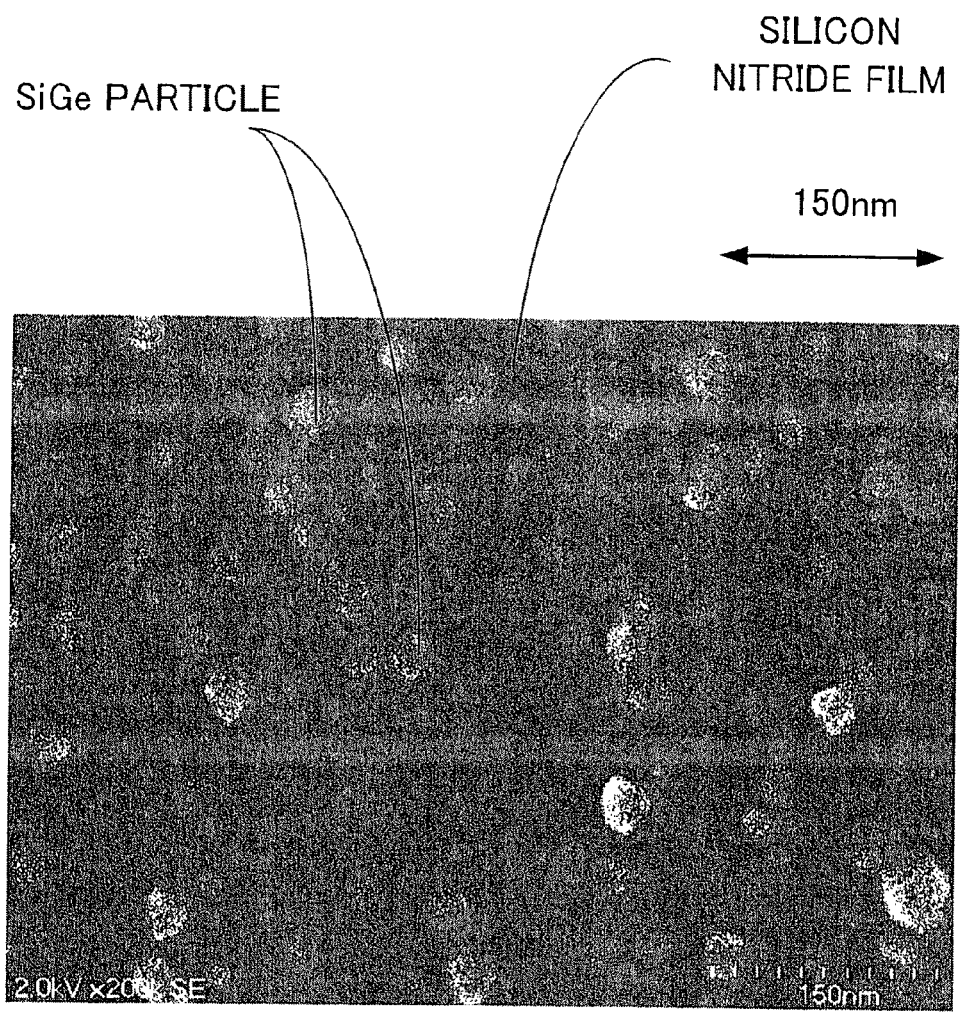
FIG. 19 is a SEM image of the surface of a CVD-silicon nitride film of sample G.

FIG. 19 is a SEM image of the surface of the CVD-silicon nitride film of sample G.

In the SEM image, each substance which looks like a white grain is an SiGe particle which has grown on the silicon nitride film, and a black portion is the silicon nitride film beneath SiGe particles. The SiGe particles 80 each having a diameter smaller than or equal to 60 nm have discretely grown.

Figure 20:
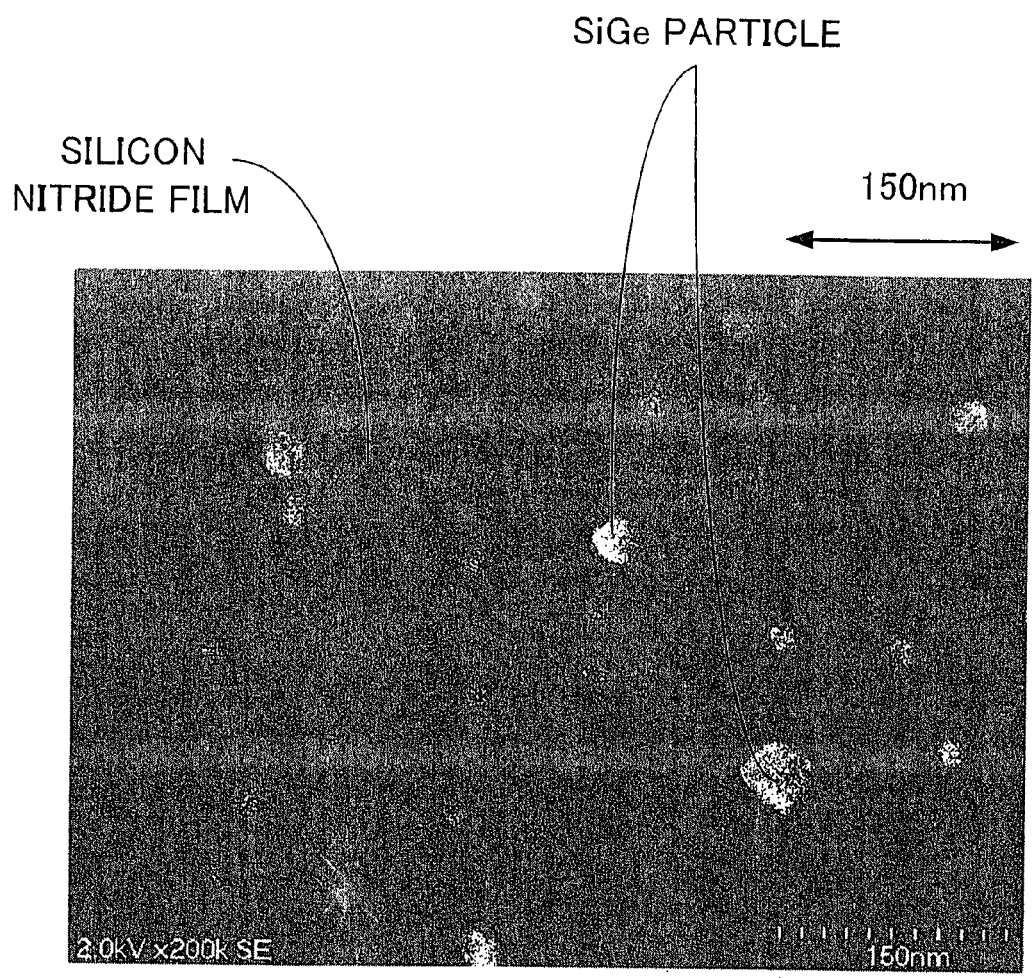
FIG. 20 is a SEM image of the surface of a CVD-silicon nitride film of sample H.
Figure 21:
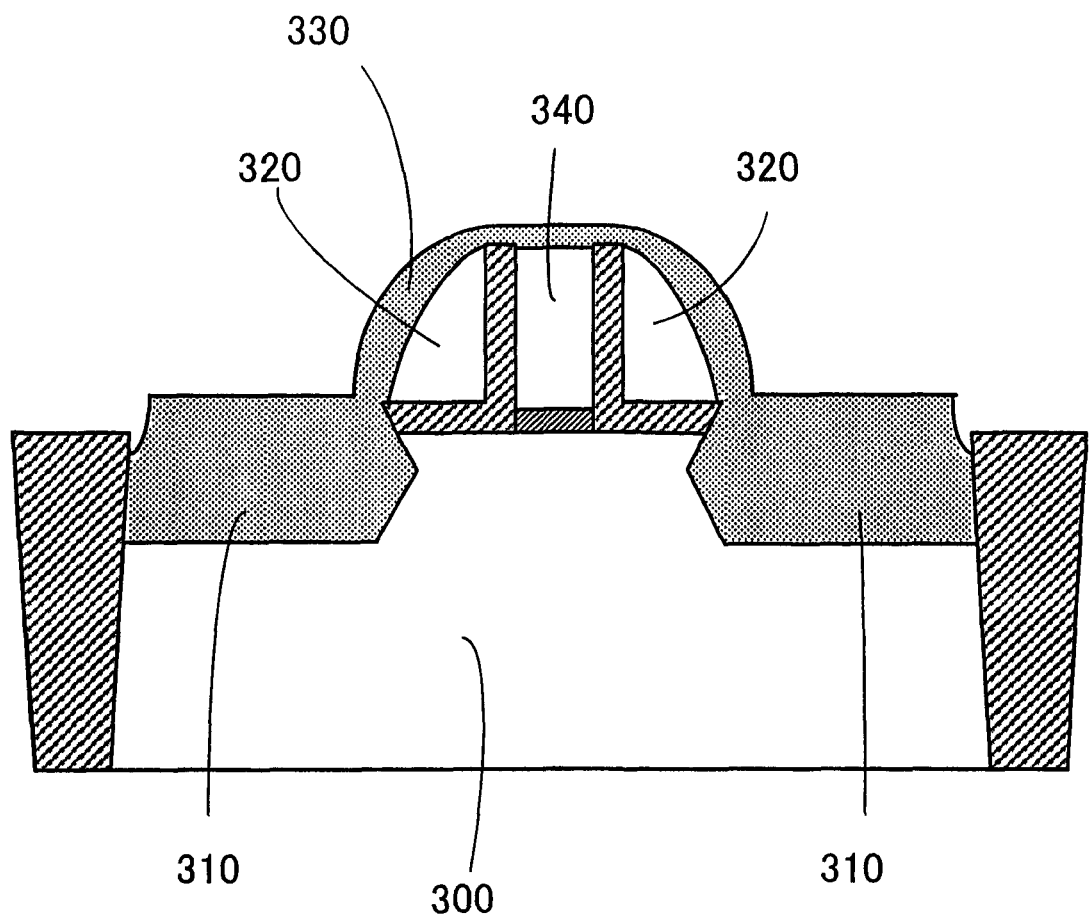
FIG. 21 is a sectional view showing an important part of a recessed source/drain MOSFET in which a deterioration in selectivity has occurred.

FIG. 20 is a SEM image of the surface of the CVD-silicon nitride film of sample H.

In this SEM image, SiGe particles each having a diameter smaller than or equal to 60 nm have discretely grown on the silicon nitride film. The number of the SiGe particles of sample F is small compared with sample G shown in FIG. 19.

A total reflection X-ray fluorescence analysis of sample H shows that just after the surface of the silicon nitride film is exposed to HCl—$H_2$ mixed gas, Cl remains on the surface of the silicon nitride film. That is to say, it is conceivable that Cl radicals which adsorb to the surface of the silicon nitride film will have the effect of suppressing the growth of SiGe on the insulating layer.

In the above example, the total pressure of HCl—$H_2$ mixed gas is 10 Pa when sample H is prepared. However, the effect of suppressing the growth of SiGe on the insulating layer can be obtained if the partial pressure of HCl is 1 to 700 Pa, the partial pressure of $H_2$ is higher than or equal to 1 Pa and lower than 10,000 Pa, and the total pressure of HCl—$H_2$ mixed gas is 10 to 10,000 Pa.

It turned out that even if the surface of the Si substrate is exposed to HCl gas, damage is not caused by etching at temperatures between 450 and 600° C.

After the surface of the Si substrate was exposed to HCl gas, the rate at which SiGe epitaxial-grows on the Si substrate did not decrease at temperatures between 450 and 600° C. To be concrete, a film was formed in as little as one or two minutes and a uniform film with a thickness of 30 to 40 nm was formed after 60 minutes.

It turns out from these results that by supplying HCl onto the Si substrate the temperature of which is between 450 and 600° C., the epitaxial growth of the semiconductor is not suppressed on the Si substrate and is suppressed on the insulating layer.

The silicon nitride films of the above samples do not contain Cl. By forming the silicon nitride film 17b and the silicon nitride film 17c which contains Cl (shown in FIG. 1) or the silicon nitride film 17d which contains Cl (shown in FIG. 2) in place of the silicon nitride film and by performing the above pretreatment, however, the epitaxial growth of the semiconductor can be suppressed further on the insulating layer.

In the above example, HCl—$H_2$ mixed gas is used as a material for suppressing epitaxial growth on the insulating layer. However, hydrogen bromide (HBr), being another halogenated hydrogen, may be used in place of HCl. Furthermore, chlorine ($Cl_2$) or bromine ($Br_2$) may be used in place of halogenated hydrogen. In addition, $H_2$ may be added as carrier gas for such a gas.

SiGe or Ge, which is also a semiconductor, may be used as the first semiconductor substrate in place of the Si substrate. Si or Ge may be used as the second semiconductor layer, of which the source/drain electrodes are formed, in place of SiGe.

$Si_2H_6$ and $Ge_2H_6$ may be used as materials for the second semiconductor layer in place of $SiH_4$ and $GeH_4$.

In addition, a material for the second semiconductor layer may be mixed with, for example, $B_2H_6$ as dopant gas. Even at a high boron (B) concentration (about 1E20 $cm^{-2}$), the electroactivity of boron incorporated in a film is about 100% and low resistivity can be realized. In this case, ion implantation and heat treatment performed after that for activation are unnecessary.

As can be seen from the foregoing, selectivity in the selective epitaxial growth method is improved at a substrate temperature between 450 and 600° C. and a manufacturing process condition suitable for actual mass production is secured.

With the semiconductor device according to the present invention, the gate electrode is formed over the semiconductor substrate with the gate insulating film therebetween and the insulating film having a laminated structure is formed over the side wall portions of the gate electrode. The halogen element content of the top layer of the insulating film is higher than the halogen element contents of the other layers of the laminated structure. The semiconductor epitaxial growth layer is formed on the semiconductor substrate.

In addition, with the semiconductor device according to the present invention, the gate electrode is formed over the semiconductor substrate with the gate insulating film therebetween and the insulating film which contains a halogen element is formed over the side wall portions of the gate electrode. The halogen element content of the insulating film has a slope. The semiconductor epitaxial growth layer is formed on the semiconductor substrate.

With the semiconductor device fabrication method according to the present invention, the first insulating film is formed over the first semiconductor layer, the second insulating film the halogen element content of which is higher than the halogen element content of the first insulating film is formed over the first insulating film, the surface of the first semiconductor layer is exposed by removing part of the first insulating film and part of the second insulating film, and the second semiconductor layer is made to selectively epitaxial-grow on the exposed surface of the first semiconductor layer by supplying a material for forming the second semiconductor layer onto the surface of the first semiconductor layer and the surface of the second insulating film.

Furthermore, with the semiconductor device fabrication method according to the present invention, the insulating film which contains a halogen element and in which the halogen element content of a surface portion is higher than the halogen element content of the inside is formed, the surface of the first semiconductor layer is exposed by removing part of the insulating film, and the second semiconductor layer is made to selectively epitaxial-grow on the exposed surface of the first semiconductor layer by supplying a material for forming the second semiconductor layer onto the exposed surface of the first semiconductor layer and the surface of the insulating film.

In addition, with the semiconductor device fabrication method according to the present invention, a material for suppressing the growth of the second semiconductor layer over the insulating film is supplied onto the surface of the first semiconductor layer and the surface of the insulating film and the second semiconductor layer is made to selectively epitaxial-grow over the first semiconductor layer by supplying a material for forming the second semiconductor layer onto the surface of the first semiconductor layer and the surface of the insulating film.

Moreover, with the semiconductor device fabrication method according to the present invention, the gate electrode is formed over the first semiconductor layer with the gate insulating film therebetween, the insulating film is formed over side wall portions of the gate electrode, a material for suppressing the growth of the second semiconductor layer over the insulating film is supplied onto the surface of the first semiconductor layer and the surface of the insulating film, and the second semiconductor layer is made to selectively epitaxial-grow over the first semiconductor layer by supplying a material for forming the second semiconductor layer onto the surface of the first semiconductor layer and the surface of the insulating film.

As a result, a semiconductor device in which a semiconductor can be made to epitaxial-grow over a semiconductor substrate with high selectivity in relation to an insulating film as a mask, and an epitaxial growth method by which a semiconductor is made to selectively epitaxial-grow can be realized.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for fabricating a semiconductor device, the method comprising:

forming a gate electrode over a first semiconductor layer;

forming a first insulating film including a first halogen element over the gate electrode and the first semiconductor layer;

forming over the first insulating film a second insulating film including a second halogen element in which a content of the second halogen element is higher than a content of the first halogen element in the first insulating film;

removing a part of the first insulating film and a part of the second insulating film to expose the first semiconductor layer while remaining another part of the first insulating film and another part of the second insulating film over a side wall of the gate electrode;

after removing the part of the first insulating film and the part of the second insulating film, forming a recess region in the first semiconductor layer; and forming a second semiconductor layer epitaxially in the recess region of the first semiconductor layer.

2. The method according to claim 1, wherein the first halogen element and the second halogen element are one of chlorine and bromine.

3. The method according to claim 1, wherein the first insulating film and the second insulating film are silicon nitride films.

4. The method according to claim 1, wherein the second semiconductor layer is SiGe.

5. The method according to claim 1, wherein the second insulating film is formed by a CVD method using gas including the second halogen element.

6. A method for fabricating a semiconductor device, the method comprising:
   forming a gate electrode over a first semiconductor layer;
   forming an insulating film which contains a halogen element over the gate electrode and the first semiconductor layer;
   removing a part of the insulating film to expose the first semiconductor layer while remaining another part of the insulating film over a side wall of the gate electrode;
   after removing the part of the insulating film, forming a recess region in the first semiconductor layer;
   forming a second semiconductor layer epitaxially in the recess region of the first semiconductor layer,
   wherein in forming the insulating film, a content of the halogen element in a surface portion of the insulating film is higher than a content of the halogen element in an inside of the insulating film, and
   wherein the insulating film is formed by a CVD method using gas including the halogen element in which the surface portion of the insulating film is formed by increasing a content of the gas including the halogen element.

7. The method according to claim 6, wherein the halogen element is one of chlorine and bromine.

8. The method according to claim 6, wherein the insulating film is a silicon nitride film.

9. The method according to claim 6, wherein the second semiconductor layer is SiGe.

10. The method according to claim 6, wherein the halogen content of the insulating film over the side wall of the gate electrode has a gradient from the inside of the insulating film to the surface portion of the insulating film.

* * * * *

UNITED STATES PATENT AND TRADEMARK OFFICE
CERTIFICATE OF CORRECTION

PATENT NO. : 8,497,191 B2
APPLICATION NO. : 12/285723
DATED : July 30, 2013
INVENTOR(S) : Masahiro Fukuda et al.

It is certified that error appears in the above-identified patent and that said Letters Patent is hereby corrected as shown below:

On the title page, Item (30);
Change

(30)    Foreign Application Priority Data

Feb. 27, 2006    (JP)............... 2007-051106
   Aug. 25, 2006    (JP)............... 2006-229917

To be

(30)    Foreign Application Priority Data

Feb. 27, 2006    (JP)............... 2006-051106
   Aug. 25, 2006    (JP)............... 2006-229917

Signed and Sealed this
First Day of October, 2013

Teresa Stanek Rea
*Deputy Director of the United States Patent and Trademark Office*